(12) United States Patent
Kanatzidis et al.

(10) Patent No.: US 8,277,677 B2
(45) Date of Patent: Oct. 2, 2012

(54) MECHANICAL STRENGTH AND THERMOELECTRIC PERFORMANCE IN METAL CHALCOGENIDE MQ (M=GE,SN,PB AND Q=S, SE, TE) BASED COMPOSITIONS

(75) Inventors: Mercouri G. Kanatzidis, Wilmette, IL (US); Joseph R. Sootsman, Pasadena, CA (US)

(73) Assignee: Northwestern University, Evanston, IL (US)

( * ) Notice: Subject to any disclaimer, the term of this patent is extended or adjusted under 35 U.S.C. 154(b) by 549 days.

(21) Appl. No.: 12/487,893

(22) Filed: Jun. 19, 2009

(65) Prior Publication Data

US 2010/0025616 A1 Feb. 4, 2010

Related U.S. Application Data

(60) Provisional application No. 61/074,781, filed on Jun. 23, 2008.

(51) Int. Cl.
*H01L 29/12* (2006.01)

(52) U.S. Cl. ............... 252/62.3 T; 136/238; 136/239

(58) Field of Classification Search ............... 252/62.3 T; 136/238, 239
See application file for complete search history.

(56) References Cited

U.S. PATENT DOCUMENTS

| | | | |
|---|---|---|---|
| 2,811,440 A | 10/1957 | Fritts et al. | |
| 2,811,571 A | 10/1957 | Fritts et al. | |
| 2,811,720 A | 10/1957 | Fritts et al. | |
| 2,811,721 A | 10/1957 | Fritts et al. | |
| 3,005,861 A * | 10/1961 | Moss et al. | 136/237 |
| 3,493,823 A * | 2/1970 | Nishizawa et al. | 257/480 |
| 3,527,622 A | 9/1970 | Angus et al. | |
| 4,608,319 A | 8/1986 | Croopnick et al. | |
| 6,013,204 A | 1/2000 | Kanatzidis et al. | |
| 6,225,548 B1 | 5/2001 | Sakakibara et al. | |
| 6,744,110 B2 | 6/2004 | Sterzel et al. | |
| 7,342,169 B2 | 3/2008 | Venkatasubramanian et al. | |
| 7,365,265 B2 * | 4/2008 | Heremans et al. | 136/238 |
| 7,465,871 B2 | 12/2008 | Chen et al. | |
| 2002/0062854 A1 | 5/2002 | Sharp | |
| 2004/0200519 A1 | 10/2004 | Sterzel et al. | |

(Continued)

FOREIGN PATENT DOCUMENTS

JP 9074229 3/1997

(Continued)

OTHER PUBLICATIONS

International Search Report and Written Opinion received in PCT/US2009/047925 , Feb. 2, 2010.

(Continued)

*Primary Examiner* — Carol M Koslow
(74) *Attorney, Agent, or Firm* — Bell & Manning, LLC

(57) ABSTRACT

Thermoelectric eutectic and off-eutectic compositions comprising a minor phase in a thermoelectric matrix phase are provided. These compositions include eutectic and near eutectic compositions where the matrix phase is a chalcogenide (S, Se, Te) of Ge, Sn, or Pb or an appropriate alloy of these compounds and at least one of Ge, $Ge_{1-x}Si_x$, Si, ZnTe, and Co are precipitated as the minor phase within the matrix. Methods of making and using the compositions are also provided. The thermoelectric and mechanical properties of the compositions make them well-suited for use in thermoelectric applications. Controlled doping of eutectic compositions and hypereutectic compositions can yield large power factors. By optimizing both the thermal conductivities and power factors of the present compositions, ZT values greater than 1 can be obtained at 700K.

23 Claims, 17 Drawing Sheets

U.S. PATENT DOCUMENTS

| | | | |
|---|---|---|---|
| 2006/0272697 | A1 | 12/2006 | Kanatzidis et al. |
| 2007/0227577 | A1 | 10/2007 | Sterzel et al. |
| 2008/0241050 | A1 | 10/2008 | Kanatzidis et al. |
| 2009/0178700 | A1 | 7/2009 | Heremans et al. |
| 2010/0025616 | A1 | 2/2010 | Kanatzidis et al. |

FOREIGN PATENT DOCUMENTS

| | | |
|---|---|---|
| JP | 2002289930 | 10/2002 |
| JP | 2003225743 | 8/2003 |

OTHER PUBLICATIONS

J. Androulakis et al, Nanostructuring and High Thermoelectric Efficiency in p-Type, $Ag(Pb_{1-y}Sn_y)_mSbTe_{2+m}$, Adv. Mater, 2006, pp. 1170-1173, vol. 18.

J. Androulakis et al, Spinodal Decomposition and Nucleation and Growth as a Means to Bulk Nanostructured Thermoelectrics: Enhanced Performance in $Pb_{1-x}Sn_xTe-PbS$, J. Am. Chem. Soc., 2007, pp. 9780-9788, vol. 129, No. 31.

J. Sootsman et al, Transport behavior and thermal conductivity reduction in the composite system PbTe- Pb-Sb, Mater. Res. Soc. Symp. Proc., 2008, pp. 327-332, vol. 1044.

P.F.P. Poudeu , High Thermoelectric Figure of Merit and Nanostructuring in Bulk p-type $Na_{1-x}Pb_mSb_yTe_{m+2}$, Angew. Chem. Int. Ed., 2006, pp. 3835-3839, vol. 45.

J.P. Heremans et al, Enhancement of Thermoelectric Efficiency in PbTe by Distortion of the Electronic Density of States, Science, 2008, pp. 554-557, vol. 321.

M.-K. Han et al, Substitution of Bi for Sb and its role in the thermoelectric properties and Nanostructuring in $Ag_{1-x}Pb_{18}MTe_{20}$ (M=Bi, Sb) (x=0, 0.14, 0.3), Chem. Mater., 2008, pp. 3512-3520, vol. 20.

Y.K. Koh et al, Lattice thermal conductivity of nanostructured thermoelectric materials based on PbTe, Appl. Phys. Lett., 2009, pp. 153101/1-153101/3, vol. 94, No. 15.

K. Ahn et al, Improvement in the thermoelectric figure of merit by La/Ag co-substitution in PbTe, Chem. Mater, 2009, pp. 1361-1367, vol. 21, No. 7.

J.R. Sootsman et al, Large enhancements in the thermoelectric power factor of bulk PbTe at high temperature by synergistic nanostructuring, Angew. Chem. Int. Ed., 2008, pp. 8618-8622, vol. 47, No. 45.

D.L. Partin et al, Lead calcium telluride grown by molecular beam epitaxy, J. Vac. Sci. Technol. B, Mar./Apr. 1986, pp. 578-580, vol. 4, No. 2, American Vacuum Society.

Dale L. Partin, Lead Salt Quantum Effect Structures, IEEE Journal of Quantum Electronics, Aug. 1988, pp. 1716-1743, vol. 24, No. 8.

D.L. Partin et al, Lead strontium telluride and lead barium telluride grown by molecular-beam epitaxy, J. Vac. Sci. Technol. B, May/Jun. 1987, pp. 686-689, vol. 5, No. 3, American Vacuum Society.

Nobuhiro Sakurai et al, Lead-Strontium-Telluride Film and Lasers Prepared by Hot-Wall Epitaxy, Jpn. J. Appl. Phys., Jan. 1994, pp. 151-154, vol. 33 part 1, No. 1A.

Kanatzidis et al., Recent Developments in Bulk Thermoelectric Materials, MRS Bulletin, vol. 31, Mar. 2006, pp. 199-205.

\* cited by examiner

MECHANICAL STRENGTH AND THERMOELECTRIC PERFORMANCE IN METAL CHALCOGENIDE MQ (M=GE,SN,PB AND Q=S, SE, TE) BASED COMPOSITIONS

CROSS-REFERENCE TO RELATED APPLICATIONS

This application claims priority from U.S. Provisional Patent Application Ser. No. 61/074,781, filed on Jun. 23, 2008, the entire disclosure of which is incorporated herein by reference.

STATEMENT REGARDING FEDERALLY SPONSORED RESEARCH OR DEVELOPMENT

This invention was made with government support under N00014-02-1-0847 awarded by Navy. The government has certain rights in the invention.

BACKGROUND

Thermoelectric materials having large figure of merit (ZT) are desirable for power conversion and refrigeration technologies. Thin-film materials have pushed the limits and extended the application of thermoelectrics to niche markets where the high cost of thin-film devices is not as important as their efficiency. If bulk materials with low-cost processing and high figure of merit can be developed, their application to mainstream markets may be realized. (See Yang, J. and T. Caillat, *Thermoelectric materials for space and automotive power generation*, MRS Bulletin, 2006, 31 (3): p. 224-229.) Current state of the art bulk materials typically have ZT maxima of approximately 1 at operating temperatures dependent on the band gap of the material. These include $Bi_2Te_3$ (ZT=0.9 at 400K) and PbTe (ZT=0.8 at 600K) and for high temperature applications SiGe alloys (ZT=0.9 at 1200K). (See Tritt, T. M., M. A. Subramanian, and Editors, *Harvesting Energy Through Thermoelectrics: Power Generation and Cooling, [In: MRS Bull.; 2006, 31 (3)]*, 2006, 113 pp.)

The figure of merit is defined as $ZT=S^2\sigma T/\kappa$ where S is the Seebeck coefficient, $\sigma$ is the electrical conductivity, and $\kappa$ the thermal conductivity. (See Rowe, D. M., *CRC handbook of thermoelectrics*, 1995, Boca Raton, Fla.: CRC Press, 70 1; Rowe, D. M., *Thermoelectrics handbook: macro to nano*, 2006, Boca Raton: CRC/Taylor & Francis, 1 v. (various pagings).) The thermal conductivity is the combination of heat carried by phonons or lattice vibrations ($\kappa_{lat}$) and electrical carriers ($\kappa_{elec}$). Many techniques have been developed for reducing the thermal conductivity in order to increase ZT such as solid solution alloying, nanostructuring (see Quarez, E., et al., *Nanostructuring, Compositional Fluctuations, and Atomic Ordering in the Thermoelectric Materials AgPbmSbTe$_{2+m}$, The Myth of Solid Solutions*, Journal of the American Chemical Society, 2005, 127 (25): p. 9177-9190; Poudeu, P. F. P., et al., *Nanostructures versus solid solutions: Low lattice thermal conductivity and enhanced thermoelectric figure of merit in $Pb_{9.6}Sb_{0.2}Te_{10-x}Se_x$ bulk materials*, Journal of the American Chemical Society, 2006, 128 (44): p. 14347-14355; Poudeu, P. F. R., et al., *High thermoelectric figure of merit and nanostructuring in bulk p-type $Na_{1-x}Pb_mSb_yTe_{m+2}$*, Angewandte Chemie-International Edition, 2006, 45 (23): p. 3835-3839; Androulakis, J., et al., *Nanostructuring and high thermoelectric efficiency in p-type $Ag(Pb_{1-y}Sn_y)(m)SbTe_{2+m}$*, Advanced Materials, 2006, 18 (9): p. 1170-+; Sootsman, J. R., et al., *Strong reduction of thermal conductivity in nanostructured PbTe prepared by matrix encapsulation*, Chemistry of Materials, 2006, 18 (21): p. 4993-4995), and investigation of new structures. (See Kanatzidis, M. G., *Structural Evolution and Phase Homologies for \"Design\" and Prediction of Solid-State Compounds*, Accounts of Chemical Research, 2005, 38 (4): p. 359-368; Nolas, G. S., J. Poon, and M. Kanatzidis, *Recent developments in bulk thermoelectric materials*, MRS Bulletin, 2006, 31 (3): p. 199-205.) The use of solid solution alloying has been used to increase phonon scattering at point defects within solids and is well understood. And although solid solution scattering is useful, the majority of phonons at the higher temperatures, where materials for power generation are most needed, are more effectively scattered by features on the nanoscale. (See Kim, W., et al., *Thermal conductivity reduction and thermoelectric figure of merit increase by embedding nanoparticles in crystalline semiconductors*, Physical Review Letters, 2006, 96 (4), Li, D., et al., *Thermal Transport in Nanostructured Solid-State Cooling Devices*, Journal of Heat Transfer, 2005, 127 (1): p. 108-114; Majumdar, A., *Materials science: Thermoelectricity in semiconductor nanostructures*, Science (Washington, DC, United States), 2004, 303 (5659): p. 777-778.) Materials engineered on the nanoscale have exhibited ZT values as high as 3 in thin-film materials (see Harman, T. C., et al., *Nanostructured thermoelectric materials*, Journal of Electronic Materials, 2005, 34 (5): p. L19-L22) and higher than 2 in bulk. (See Hsu, K. F., et al., *Cubic $AgPb_mSbTe_{2+m}$: Bulk Thermoelectric Materials with High Figure of Merit*, Science (Washington, DC, United States), 2004, 303 (5659): p. 818-821.) The increases in ZT reflect the low thermal conductivity brought about by phonon scattering at the interfaces of nanoscale features and the "matrix" of the semiconductor with values of the lattice thermal conductivity approaching 0.35 W/mK. Drawbacks in thin-film materials such as their cost and processing difficulties have prompted the exploration of new methods to prepare bulk nanostructured materials. Such materials have been realized through the use of processes such as matrix encapsulation (see Sootsman, J. R., et al., *Strong reduction of thermal conductivity in nanostructured PbTe prepared by matrix encapsulation*, Chemistry of Materials, 2006, 18 (21): p. 4993-4995), spinodal decomposition (see Androulakis, J., et al., *Spinodal Decomposition and Nucleation and Growth as a Means to Bulk Nanostructured Thermoelectrics: Enhanced Performance in Pb1-xSnxTe—PbS*, Journal of the American Chemical Society: p. ACS ASAP), and nucleation and growth. (See Heremans, J. P., C. M. Thrush, and D. T. Morelli, *Thermopower enhancement in PbTe with pb precipitates*, Journal of Applied Physics, 2005, 98 (6).)

A report by Snyder and coworkers describes the decomposition of a metastable $Pb_2Sb_6Te_{11}$ into PbTe and $Sb_2Te_3$ through a eutectoid reaction. (See Heremans, J. P., C. M. Thrush, and D. T. Morelli, *Thermopower enhancement in PbTe with Pb precipitates*, Journal of Applied Physics, 2005, 98 (6); Ikeda, T., et al., *Solidification processing of alloys in the pseudo-binary PbTe—Sb2Te3 system*, Acta Materialia, 2007, 55 (4): p. 1227-1239.) This method produced a lamellar structure of alternating phases with layer period ranging from approximately 200-950 nm depending on annealing temperature and times. Others have explored eutectic type phase relationships for thermoelectric applications although they typically were composed of a semiconductor (III-V and IV-VI compounds) and a metal (Te, Sb, and others). (See Isakov, G. I., *Phonon Scattering, Thermoelectric Power, and Thermal Conductivity Control in a Semiconductor-Metal Eutectic Composition*, Semiconductors, 2005, 39 (7): p. 738-741; Isakov, G. I., *Control of electric and thermal properties of composites with whiskers*, Journal of Engineering Physics and Thermophysics (Translation of Inzhenerno-Fizicheskii Zhurnal), 2004, 77 (5): p. 1062-1068; Park, C.-G., B.-G. Min, and D.-H. Lee, *Thermoelectric properties of unidirectionally solidified Bi2Te3-PbBi4Te7 eutectic alloy*, Han'guk Chaelyo Hakhoechi, 1995, 5 (2): p. 251-8; Dement'ev, I. V. and V. V. Leonov, *The effect of temperature on the thermoelectric properties of the eutectic alloys of the systems AIIIBIV-germanium*, Izvestiya Akademii Nauk SSSR, Neorganicheskie Materialy, 1988, 24 (1): p. 24-7; Leonov, V. V. and Z. K. Gantimurova, *Thermoelectric properties of a eutectic alloy of indium arsenide with germanium*, Izvestiya Akademii Nauk SSSR, Neorganicheskie Materialy, 1987, 23 (11): p. 1915-17; Leonov, V. V. and Y. E. Spektor, *Thermoelectric properties of the germanium-gallium arsenide eutectic alloy*, Izvestiya Akademii Nauk SSSR, Neorganicheskie Materialy, 1980, 16 (8): p. 1358-60.) The use of oriented eutectics has also been shown in thermoelectric composites where the Seebeck coefficient, electrical and thermal conductivity can be tuned by the angle with respect to growth direction. (See Isakov, G. I., *Phonon Scattering, Thermoelectric Power, and Thermal Conductivity Control in a Semiconductor-Metal Eutectic Composition*, Semiconductors, 2005, 39 (7): p. 738-741; Isakov, G. I., *Control of electric and thermal properties of composites with whiskers*, Journal of Engineering Physics and Thermophysics (Translation of Inzhenerno-Fizicheskii Zhurnal), 2004, 77 (5): p. 1062-1068; Leonov, V. V., *Properties of eutectic alloys of the systems AIIIBV-germanium (silicon) prepared by directed crystallization*, Izvestiya Akademii Nauk SSSR, Neorganicheskie Materialy, 1985, 21 (2): p. 320-1; Liebmann, W. K. and E. A. Miller, *Preparation, phase—boundary energies, and thermoelectric properties of InSb—Sb eutectic alloys with ordered microstructures*, Journal of Applied Physics, 1963, 34 (9): p. 2653-9.)

BRIEF SUMMARY

Thermoelectric compositions, methods for making the thermoelectric compositions and methods for using the thermoelectric compositions in power generation are provided. Accordingly, in one aspect, the present invention relates to thermoelectric materials for waste heat to electrical energy conversion and Peltier cooling applications that have been developed by taking advantage of eutectic phase relationships between a thermoelectric material and a secondary phase. The resulting compositions exhibits enhanced mechanical integrity and improved thermoelectric performance. The improved properties obtained in these compositions can be utilized in current thermoelectric devices where improved mechanical integrity is necessary and can extend to new applications where robust materials were not previously available, such as automotive and military applications. The improved thermoelectric performance may also extend the use of these materials into new applications.

One aspect of the invention provides composition comprising a minor phase comprising $Ge_{(1-x)}Si_x$, ZeTe, Co, or a combination thereof in a matrix comprising a compound having the formula MQ, wherein M is Ge, Sn, Pb, or a combination thereof and Q is S, Se, Te, or a combination thereof In some embodiments of these compositions x can have a value from 0 to 1. The compositions can be eutectic or hypereutectic mixtures of the matrix and minor phases and can be designed to have ZT values of at least 1 at 700 K.

Some embodiments of the thermoelectric compositions comprise a matrix comprising PbTe, a minor phase comprising $Ge_{(1-x)}Si_x$ and a dopant, wherein the $Ge_{(1-x)}Si_x$ is dispersed in the PbTe and the value of x can be from 0 to 1.

Some embodiments of the thermoelectric compositions comprise PbTe and $Ge_{(1-x)}Si_x$, wherein the $Ge_{(1-x)}Si_x$ is a minor phase dispersed in a PbTe matrix and x is from 0.05 to 0.95.

In some embodiments of the compositions, the $Ge_{(1-x)}Si_x$ is present in an amount of about 2 to about 30 mol. %, based on the total amounts of the matrix and minor phase. The compositions can be doped to increase their electrical conductivities. $PbI_2$ is one example of a suitable dopant. The compositions can have relatively high ZT values. For example, the compositions can be designed to have a ZT value of at least 0.6 at 675 K, a ZT value of at least 1 at 700 K or even a ZT value of at least 1.2 at 750K. In some embodiments, the compositions comprise a eutectic mixture of the PbTe and $Ge_{(1-x)}Si_x$ phases, while in other embodiments the compositions comprise on off-eutectic (e.g., hypereutectic) mixtures of the PbTe and $Ge_{(1-x)}Si_x$ phases. The compositions can be characterized by a high Vickers hardness (e.g., >0.4 GPa) relative to a PbTe composition. In some embodiments, wherein the matrix comprises PbTe and the minor phase comprises $Ge_{(1-x)}Si_x$ with $x=0$, the composition comprises a eutectic mixture of the PbTe and the Ge and has a ZT of at least 0.6 at 675 K. In some embodiments, wherein the matrix comprises PbTe and the minor phase comprises $Ge_{(1-x)}Si_x$ with $x=1$ the composition comprises a hypereutectic mixture of the PbTe and the Si and has a ZT of at least 0.8 at 675 K.

The thermoelectric compositions can be made by combining a compound having the formula MQ, wherein M is Ge, Sn, Pb or a combination thereof and Q is S, Se, Te or a combination thereof, with $Ge_{(1-x)}Si_x$, ZnTe, Co or a combination thereof, and a dopant under vacuum and heating the combination at a temperature and for a time sufficient to form a composition comprising a minor phase of $Ge_{(1-x)}Si_x$, ZnTe, Co or a combination thereof dispersed in a matrix of the compound having the formula MQ, wherein x can have a value from 0 to 1. In some embodiments, the methods are used to produce compositions wherein the minor phase is $Ge_{(1-x)}Si_x$, the matrix is PbTe and the $Ge_{(1-x)}Si_x$ is present in an amount of about 2 to about 30 mol. %, based on the total amount of the matrix and minor phase.

The thermoelectric compositions can be used for power generation by placing one or more of the compositions in thermal contact with a heat source, whereby the composition generates electricity, and powering an electrical device with the generated electricity.

DETAILED DESCRIPTION

Figure 1:
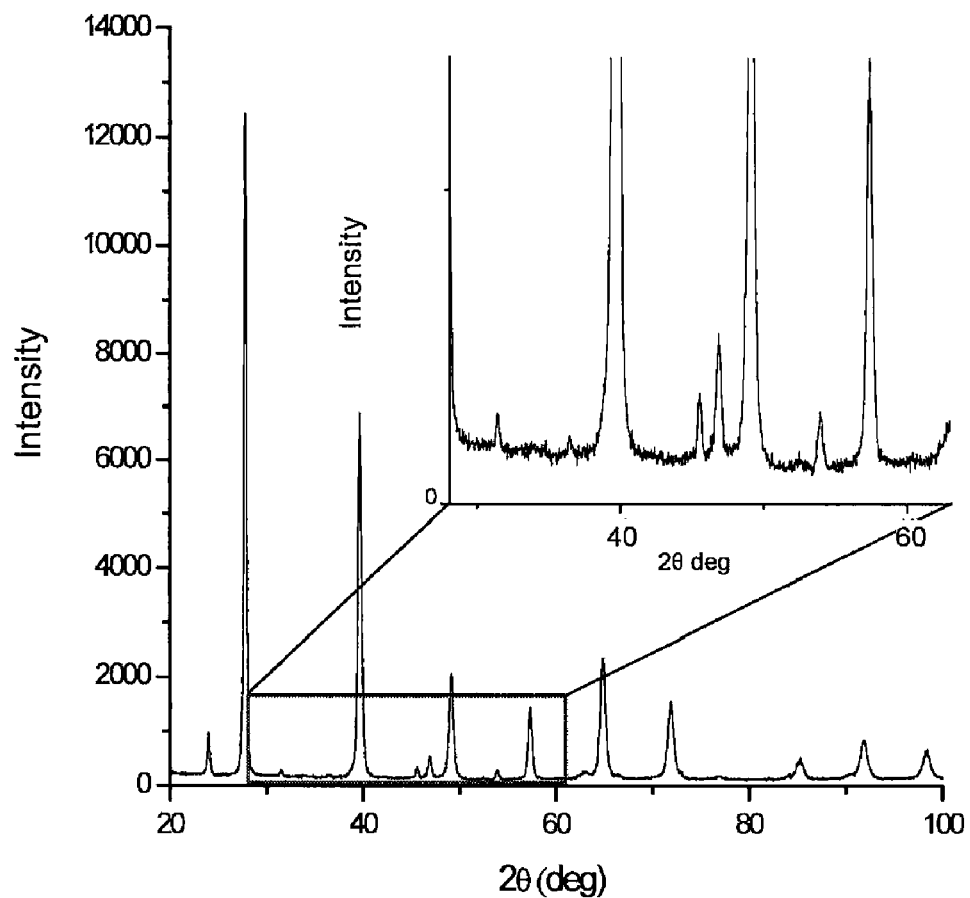
FIG. 1 shows the powder X-ray diffraction for a PbTe—Ge(20%) sample showing the PbTe, Ge, and Pb phases.

Thermoelectric eutectic and off-eutectic compositions comprising a minor phase in a thermoelectric matrix phase are provided. These compositions include eutectic and near eutectic compositions where the matrix phase is a chalcogenide (S, Se, Te) of Ge, Sn, or Pb or an appropriate alloy of these compounds and at least one of Ge, Ge$_{1-x}$Si$_x$, Si, ZnTe, and Co are precipitated as the minor phase within the matrix. This class of materials can be generalized to many eutectic compositions with PbTe. For purposes of illustrating the invention, the description that follows focuses on a PbTe—Ge and PbTe—Ge$_{(1-x)}$Si$_x$ family of composites. However, it should be understood that the methods of investigation and property enhancements described herein may be generalized to other systems as well.

In one aspect of the invention, compositions composed of a minor phase of Ge$_{(1-x)}$Si$_x$ in a matrix of PbTe, wherein x can range from 0 to 1 are provided. Methods of making and using the compositions are also provided. The thermoelectric and mechanical properties of the compositions make them well-suited for use in thermoelectric applications. The thermal conductivity in the compositions can be tuned by using hypereutectic compositions and/or by replacing a portion of the Ge in a PbTe—Ge (i.e., x=0) composition with the lower thermal conductivity alloy Ge$_{(1-x)}$Si$_x$. Controlled doping of eutectic compositions and hypereutectic compositions can yield large power factors. By optimizing both the thermal conductivities and power factors of the present compositions, ZT values greater than 1 can be obtained at 700K.

As noted above, the Ge$_{(1-x)}$Si$_x$ in the present compositions is present as a minor phase dispersed in a matrix of the PbTe material. The minor phase can take the form of rod-shaped precipitates, the dimensions of which depend on the chemical composition of the minor phase. In some compositions, small amounts of other phases, such as Pb and Si$_2$Te$_3$, can also be present. The microstructures of several embodiments of the compositions are described in detail in Examples 1 and 2, below.

The relative amounts of the minor Ge$_{(1-x)}$Si$_x$ phase and the major PbTe phase in the compositions can vary widely. For example, in some embodiments, the Ge$_{(1-x)}$Si$_x$ phase is present in an amount of about 2 to about 30 mol. % based on the total amount of PbTe and Ge$_{(1-x)}$Si$_x$ in the composition. The compositions can be eutectic compositions of the minor and major phases. However, they can also be off-eutectic compositions, such as hypereutectic compositions. The use of hypereutectic compositions in thermoelectric applications can be advantageous because, as illustrated in the Examples below, the thermal conductivities of hypereutectic compositions of PbTe and Ge$_{(1-x)}$Si$_x$ can be substantially lower than those of their eutectic counterparts. Thus, in some embodiments of the PbTe—Ge system (i.e., x=0), Ge is present in an amount of about 2.5 to about 10 mol. %.

In some embodiments, the minor phase is composed of a single element (i.e., when x=0 or x=1), while in other embodiments the minor phase comprises an alloy of Ge and Si. The use of a GeSi alloy as the minor phase can be advantageous because, as illustrated in the Examples below, replacing some of the Ge in the minor phase with Si can reduce the thermal conductivity of the composition. Thus, in some embodiments of the PbTe—Ge$_{(1-x)}$Si$_x$ systems, x is in the range of 0.05 to 0.95. This includes embodiments where x is in the range of 0.05 to 0.3 and further includes embodiments where x is in the range of 0.15 to 0.25.

Some embodiments of the PbTe—Ge$_{(1-x)}$Si$_x$ compositions take advantage of both a reduced minor phase content and a reduced Ge content to provide compositions with particularly low thermal conductivities and, therefore, improved ZT values. Examples of such compositions include PbTe—Ge$_{(1-x)}$Si$_x$ compositions where the Ge$_{(1-x)}$Si$_x$ is present in an amount of 2 to about 10 mol. % based on the total amount of the PbTe and Ge$_{(1-x)}$Si$_x$ in the composition and x is in the range of 0.15 to 0.25.

The compositions can be doped with one or more dopants to increase their electrical conductivities and improve their ZT values. The dopants can be any suitable dopants that improve the electrical conductivity of the compositions relative to their undoped counterparts. PbI$_2$ is one example of a suitable dopant. Other suitable n-type dopants include other metal halide salts (where a metal is a transition of a main group metal) and metals including Sb, Bi, Pb among others. P-type dopants include Na, K, Tl, Sr, Ag, among others. The appropriate concentrations of dopant in the compositions can vary depending upon a variety of factors, including the operating temperature of the composition, the particular dopant used and the chemical content of the compositions. By way of illustration only, in some embodiments the compositions have a PbI$_2$ dopant concentration of about 0.01 to about 0.08 mol. %. This includes embodiments where the compositions have a PbI$_2$ dopant concentration of about 0.012 to about 0.05 mol. %.

The present compositions are characterized by electrical and thermal transport characteristics that make them well-suited for use in thermoelectric applications. For example, the compositions can be tuned to have high electrical conductivities, low thermal conductivities, and high Seebeck coefficients. As a result, compositions having high power factors and high ZT values can be provided. The ZT values for the compositions are measured according to the following equation:

$$ZT = (S^2 \sigma T/\kappa) \quad \text{Eq. 1}$$

where S is the Seebeck coefficient, σ is the electrical conductivity, T is the temperature and κ is the total thermal conductivity for the composition. In some embodiments, the compositions exhibit optimized electrical and thermal transport properties at temperatures of 300K to 750K (e.g., 300K to 700K) or even higher. In particular, the ZT values for the compositions can be at least 0.6 at 675K or above. This includes compositions having ZT values of at least 0.7 at 675K or above, further includes compositions having ZT values of at least 1 at 700K or above, and still further includes compositions having ZT values of at least 1.3 at 778K or above.

The power factor is the Seebeck coefficient squared multiplied by the electrical conductivity. In some embodiments, the present compositions can have room temperature (298 K) power factors in the range of 12 to 40 μW/cmK².

For the purposes of this disclosure, the values of S, σ, and κ for each composition are measured as described immediately below and in the examples that follow.

Electrical conductivity (σ) is measured using a four probe method with spring loaded current contacts using a sample (parallelepiped) with dimensions of 3×3×10 mm. A more detailed description of the method for measuring the electrical conductivity, including instrumentation that can be used to make the measurements and methods that can be used to synthesis the coins is provided in Examples 1 and 2, below. The electrical conductivities of the compositions will depend on such factors as the level of doping and the temperature. By way of illustration only, some embodiments of the present doped compositions can be designed to have room temperature (298K) electrical conductivities of about 500 to about 4500 S/cm. This includes compositions having room temperature electrical conductivities of about 1000 to about 3000 S/cm.

Seebeck coefficients (S) are measured on parallelepipeds with dimensions of 3×3×10 mm. A more detailed description of the method for measuring the Seebeck coefficient, including instrumentation that can be used to make the measurements is provided in Examples 1 and 2, below. Like electrical conductivities, the Seebeck coefficients of the compositions depend upon the level of doping and temperature. By way of illustration only, some embodiments of the present doped compositions can be designed to have room temperature Seebeck coefficients of about −150 to about −50 μV/K. This includes compositions having room temperature Seebeck coefficients of about −140 to about −80 μV/K.

Thermal conductivities (κ) are measured using the laser flash method from 300K to 700K based on the following equation:

$$\kappa = D\rho C_p \quad \text{Eq. 2}$$

where D is the diffusivity, ρ is the density and $C_p$ is the specific heat of the composition. The coin dimensions for the thermal conductivity measurements are 12.7 mm in diameter and 2-2.5 mm thick. A more detailed description of the method for measuring the thermal conductivity, including instrumentation that can be used to make the measurements is provided in Examples 1 and 2, below. By way of illustration only, some embodiments of the present compositions can be designed to have room temperature total thermal conductivities of about 1.8 to 4 W/mK. This includes compositions having room temperature thermal conductivities of about 1.8 to 2.5 W/mK.

In addition to superior thermoelectric properties, the present compositions can have enhanced mechanical strengths. As such, relative to PbTe these compositions can exhibit improved machinability and crack resistance during the cutting, polishing and transport processes associated with sample analysis. Vickers hardness is one measure of the mechanical strengths of the compositions. Vickers hardness ($H_v$) is a measure of a material's resistance to plastic deformation and is calculated using the dimensions of an indentation impression according to the following equation:

$$H_v = (1.854P)/((2a)^2) \quad \text{Eq. 3}$$

where P is the indentation load and 2a is the diagonal length of the indentation. A Buehler Semi-Macro indenter can be used with a square pyramid Vickers indenter. Three duplicate indentations were made suing a loading time of 10 seconds with a speed of 70 μm/sec at loads of 2.94N, 4.91N, and 9.81N to determine the hardness. The Vickers hardness values for the compositions depend on the chemical content and amount of minor phase present. Various embodiments of the present compositions have Vickers hardness values of at least 0.4 GPa. For example, in some embodiments the compositions have a Vickers hardness of about 0.4 to 0.9 GPa. Details regarding the Vickers hardness values for several PbTe/$Ge_{(1-x)}Si_x$ compositions are provided in Example 3, below.

Methods for making the doped compositions are described in detail in the examples below. Briefly, the appropriate molar concentration of the constituent materials can be sealed under vacuum (e.g., in quartz ampoules) and heated to the single phase liquid region established by the phase diagram. The material can then be allowed to homogenize in the melt for a sufficient length of time (e.g., 10-12 hrs) after which it can be quenched in cold water. The resulting ingots can then be cut and prepared for powder X-ray diffraction, microscopic investigation, electrical transport, and thermal transport measurements. The PbTe—$Ge_{(1-x)}Si_x$, compositions can be made by combining Pb and Te or PbTe with one or more of Si, Ge and $Ge_{(1-x)}Si_x$ and a dopant, under vacuum and heating the combination at a temperature and for a time sufficient to form a composition characterized by a $Ge_{(1-x)}Si_x$ phase dispersed in a second phase of PbTe, wherein x is from 0 to 1. In some embodiments, the methods are used to make a composition in which $Ge_{(1-x)}Si_x$ is present in an amount of about 2 to about 30 mol. %, based on the total amount of the PbTe and $Ge_{(1-x)}Si_x$.

A basic method for using the compositions for power generation includes the steps of placing a composition, such as a PbTe/$Ge_{(1-x)}Si_x$ composition, in thermal contact with a heat source, whereby the composition generates electricity, and subsequently using the generated electricity to power an electrical device. As such, the compositions can find applications in the automobile industry, heavy truck and vehicle manufacturing, coal burning electric utilities and nuclear reactor facilities. In fact, the present compositions can be utilized in any systems or apparatus that uses an internal combustion engine (moving or stationary). For example, the thermoelectric compositions can be placed in thermal contact with an automobile engine or exhaust in order to generate electricity from the automobile's waste heat. This electricity could then be used to power other automobile components, such as a radio or air conditioner.

The following examples provide a non-limited description of certain embodiments of the present compositions and methods for making and characterizing the compositions. Descriptions can also be found in Sootsman et al., Journal of Applied Physics, 105, pp. 083718-083718-8 (2009), the entire disclosure of which is incorporated herein by reference.

EXAMPLES

Example 1

PbTe—Ge and PbTe—Ge$_{(1-x)}$Si$_x$ Systems

This example reports the structure and thermoelectric properties of a PbTe—Ge eutectic system and a PbTe—Ge$_{(1-x)}$Si$_x$ (x>1) system.

The PbTe—Ge system has a simple pseudo-binary eutectic relationship. The eutectic occurs at approximately 20 at. % Ge and 80% PbTe. Ge has very limited solubility in PbTe although the Pb$_{1-x}$Ge$_x$Te system is a solid solution having a moderate thermoelectric figure of merit. It was observed that the slight solubility of Ge in PbTe resulted in Pb precipitation as well as the formation of rod-like microscale features of Ge. These rod-like features were on the order of 10-50 μm long and 500 nm-1 μm in diameter. The PbTe(80%)-Ge(20%) composition was tuned through doping with PbI$_2$ and to obtain ZT values comparable to those in PbTe itself. Remarkably, the thermal conductivity of this system was similar to the expected PbTe lattice thermal conductivity and did not follow a simple law of mixtures of the thermal conductivity of PbTe and Ge. The hypereutectic compositions prepared showed lower thermal conductivity than that of the eutectic where a minimum was obtained for the PbTe(95%)-Ge(5%) composition. When the alloy of Ge and Si was used rather than the pure Ge another significant reduction in thermal conductivity was obtained. For the PbTe(95%)-Ge$_{0.8}$Si$_{0.2}$ (5%) composition a minimum in the thermal conductivity was obtained and a ZT value of approximately 1.2 at 700K was achieved through doping.

Experimental
Synthesis

PbTe and the appropriate concentration of Ge or Ge$_{(1-x)}$Si$_x$ along with PbI$_2$ were combined in 12.7 mm quartz ampoules and sealed under vacuum to prevent oxidation at high temperatures. The samples were heated to 1000° C. in the case of the Ge samples and 1100° C. for the Si containing alloys. The samples were allowed to homogenize at the isotherm for 24 hrs and were then quenched in a room temperature H$_2$O bath to allow rapid solidification of the eutectic. The resulting ingots were cut and polished for thermal, electrical, and structural characterization.

Powder X-ray Diffraction

Finely ground powders were prepared and diffraction experiments were performed using an Inel X-ray powder diffractometer (Cu K$_\alpha$ radiation) operating at 40 kV/20 mA for phase identification and analysis.

Electron Microscopy

Scanning electron microscopy was used to determine the microstructure of the eutectic compositions through the use of backscattered electron imaging. An operating voltage of 20 keV was used for both imaging and energy dispersive spectroscopy.

Electrical Transport Characterization

Temperature dependent electrical conductivity and Seebeck coefficient measurements were performed using a ULVAC Technologies ZEM3. The electrical conductivity was determined using a 4-probe method with spring loaded current contacts. Type R thermocouples doubled as both voltage leads and were used for measurement of temperature during Seebeck coefficient measurement. For the Seebeck measurements, temperature gradients of 5, 10, and 15° were used and the corresponding voltage differences and temperature differences were then averaged. A temperature stability of 0.25° was used over the course of the measurement at each temperature step.

Thermal Conductivity/Diffusivity Characterization

A Netzsch LFA-457 was used to measure temperature dependent thermal diffusivity and heat capacity in the temperature range of 300-700K. Coins 12.7 mm in diameter and 2-2.5 mm thick were used in all measurements and the thermal conductivity in these samples was determined using the laser flash diffusivity heat capacity method from 300 to 700K. The diffusivity (D), density (ρ), and specific heat (C$_p$) were measured and used to calculate the total thermal conductivity using the formula κ=DρC$_p$. In order to compare samples directly without the influence of charge carriers the lattice thermal conductivity was calculated from κ$_{lattice}$=κ$_{total}$−κ$_{elec}$. The contribution from carriers is typically described by the Wiedemann-Franz law where the electronic contribution is calculated using κ$_{elec}$=L$_o$σT where L$_o$ is the Lorentz number for metals and degenerate semiconductors (L$_o$=2.45*10$^{-8}$ Wσ/K$^2$), σ is the electrical conductivity, and T the temperature. (See Kittel, C., *Introduction to solid state physics*, 8th ed, 2005, Hoboken, N.J.: Wiley, xix, 680.)

Results and Discussion:
PbTe(80%)-Ge(20%)

Powder X-ray diffraction revealed that the expected PbTe and Ge phases were present along with a small fraction of Pb metal (FIG. 1). This Pb was not present in the starting material and was likely the result of solubility of Ge in PbTe. During reaction Ge displaced Pb and was oxidized to Ge$^{2+}$ while the Pb ions were reduced and precipitated as Pb metal. The PbTe reflections are shifted slightly and are attributed to the incorporation of a small amount of Ge within the PbTe lattice.

Figure 2:
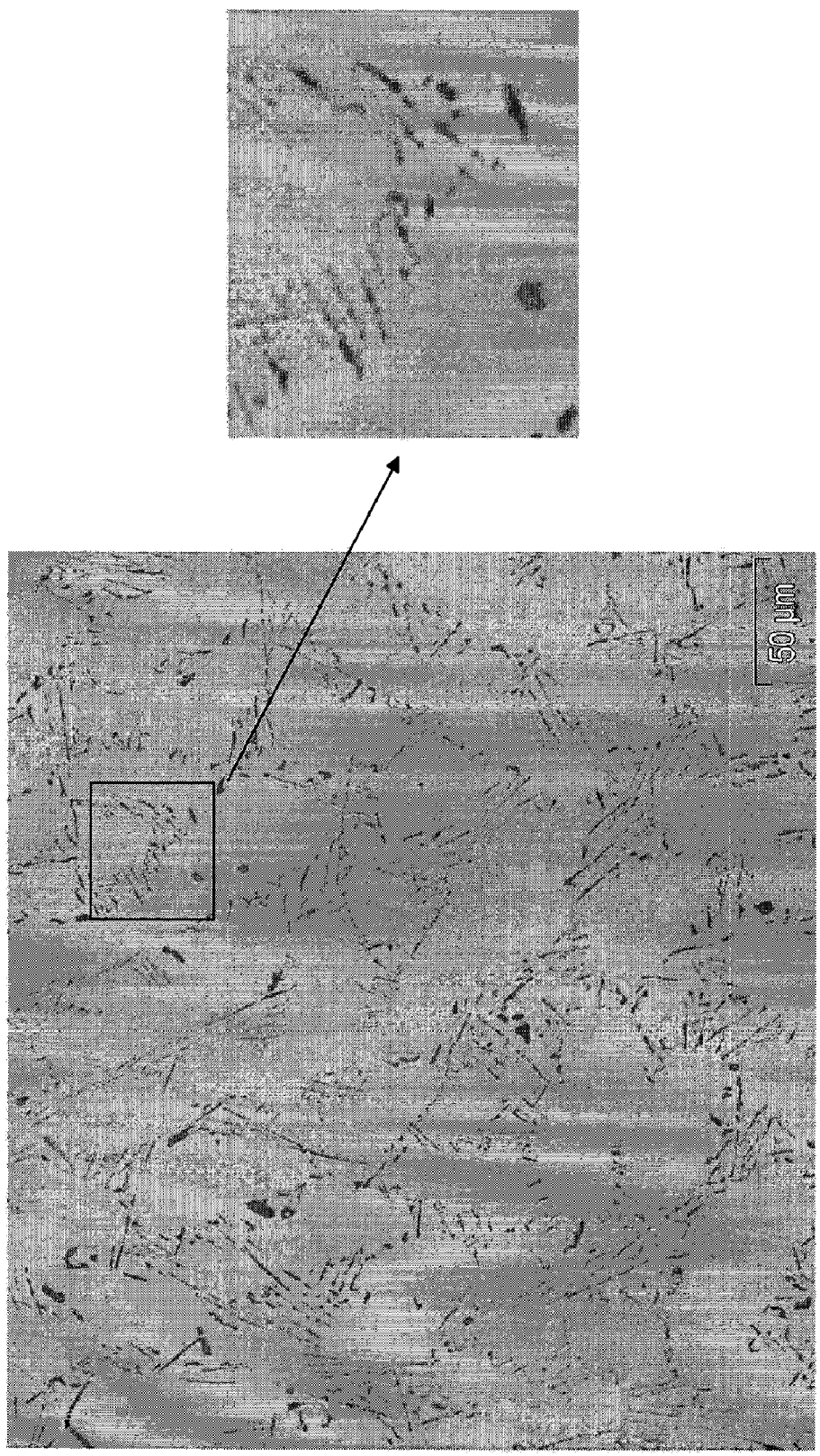
FIG. 2 is a scanning electron microscope image of the PbTe(80%)-Ge(20%) eutectic showing the rod-like microstructure of Ge in the PbTe matrix. The light color is PbTe and the darker regions are Ge.

Scanning electron microscopy revealed that the PbTe—Ge eutectic composition resulted in a rod-like microstructure with regions of Ge forming the rods. The remaining "matrix" was composed of PbTe (FIG. 2). The rods of Ge formed through the rapidly solidified eutectic were 10-50 μm long and 500 nm-1 μm in diameter and were randomly oriented in the PbTe. No Pb was observed through backscattered electron imaging in the samples despite the reflections observed in powder X-ray diffraction. Possibly the Pb precipitates were smaller than what was observed by scanning electron microscopy.

Investigation with transmission electron microscopy showed that these systems are complex on several length scales. Within the bulk material there exist three regions of interest: large Ge precipitates, the boundary between Ge and PbTe, and within the PbTe region itself. The Ge domains were pure Ge with little solubility of PbTe. Electron diffraction showed that regions within the PbTe domains were often pure without additional reflections while other areas did show nanoscale precipitates. Within certain areas of the PbTe region it appeared that these small (2-5 nm) precipitates were present, and based on contrast differences they appear to be Pb. The boundary between the two phases, PbTe and Ge, was not coherent and the Ge domains did not have a preferred orientation with the PbTe domains.

Figure 3A:
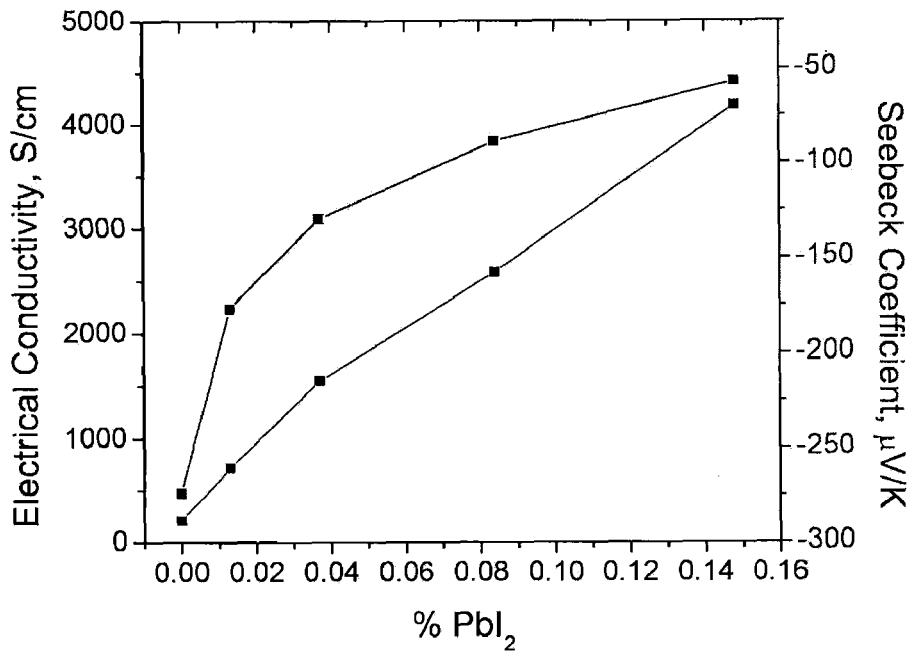
FIG. 3 shows the room temperature transport of the PbTe—Ge(20%) samples doped with various amounts of $PbI_2$ showing (a) the electrical conductivity increases linearly and Seebeck coefficient decreases monotonically as a function of $PbI_2$ doping, and (b) power factor showing maximum at approximately 0.037% $PbI_2$.
Figure 3B:
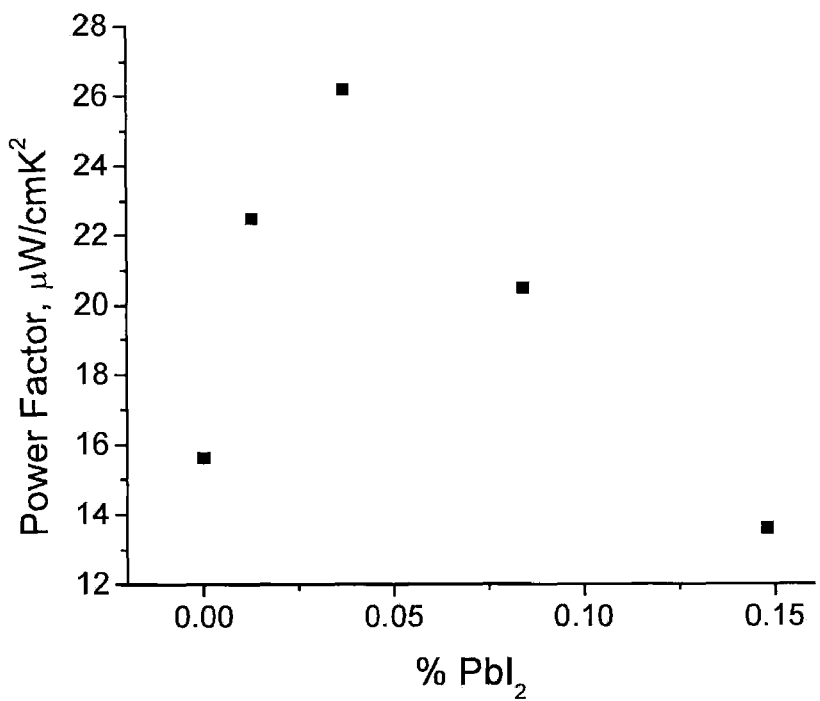

Room temperature electrical conductivity and Seebeck coefficient measurements of the PbTe(80%)-Ge(20%) composition doped with various amounts of PbI$_2$ showed that the electrical transport in the composite can be tuned. A linear relationship of the electrical conductivity with the PbI$_2$ doping concentration follows the relationship $\sigma=N\mu e$ where N is the carrier concentration, $\mu$ the mobility, and e the electron charge. As the concentration of $PbI_2$ was increased a linear increase in the electrical conductivity was observed due to the increase in carrier concentration (N); as shown in FIG. 3. The Seebeck coefficient showed a more complicated dependence on $PbI_2$ concentration where samples with low $PbI_2$ doping concentrations have large Seebeck coefficients which decreased as the concentration of $PbI_2$ was increased. The resulting power factor thus reached a maximum at 0.037% $PbI_2$, corresponding to a carrier concentration of $9.46\times10^{18}$ $cm^3$.

Figure 4A:
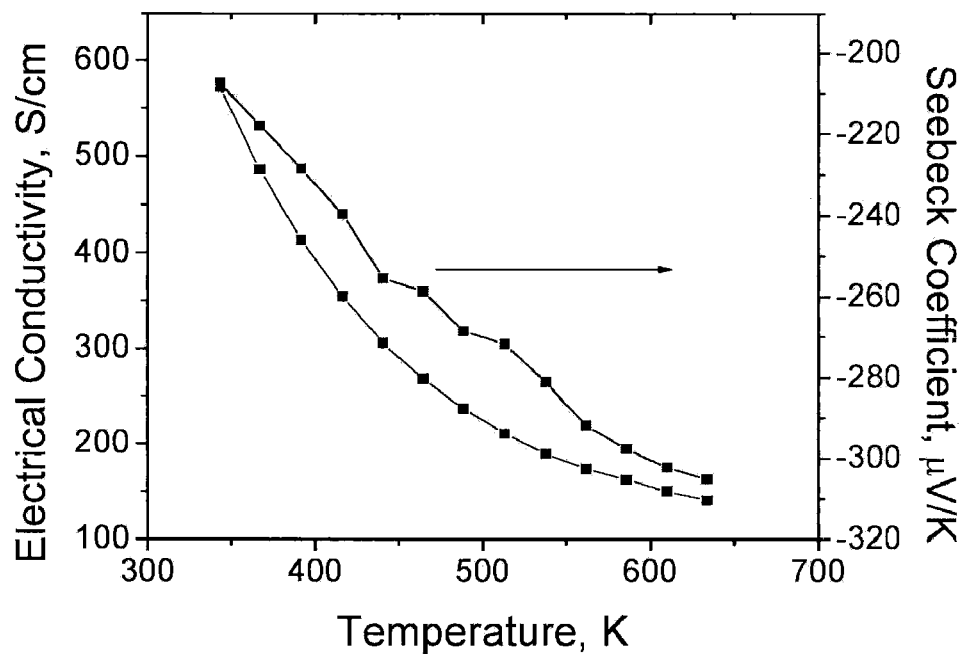
FIG. 4 shows the temperature dependent (a) electrical conductivity and Seebeck coefficient, (b) power factor, (c) lattice thermal conductivity, and (d) corresponding ZT of PbTe—Ge (20%) doped with 0.037% $PbI_2$.
Figure 4B:
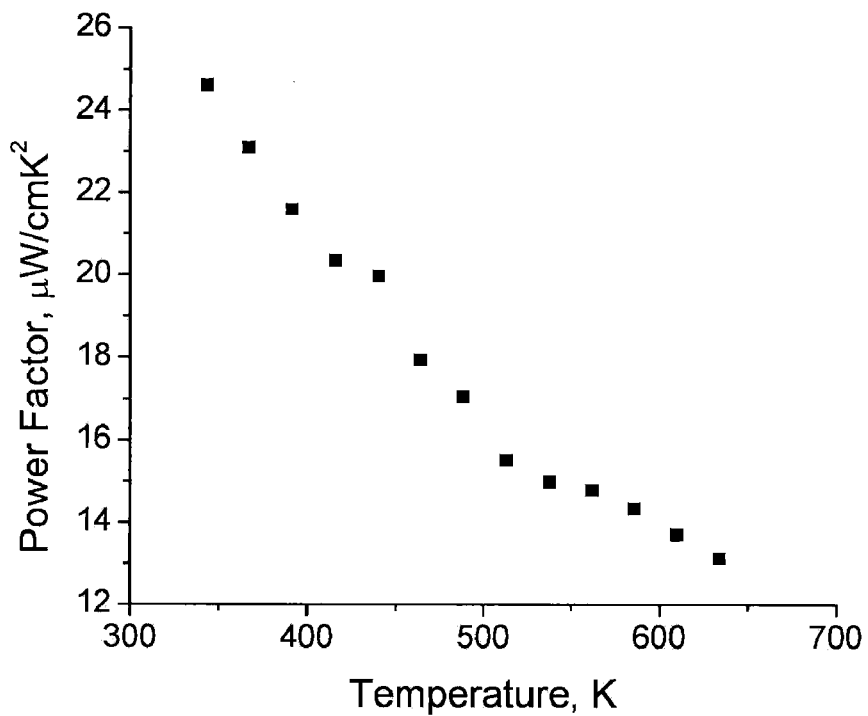
Figure 4C:
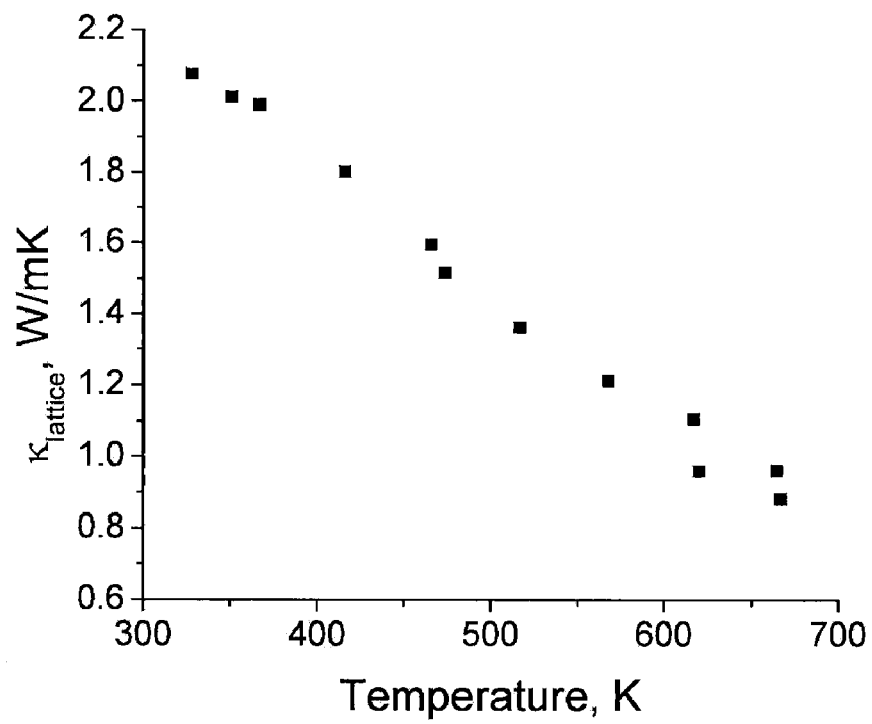
Figure 4D:
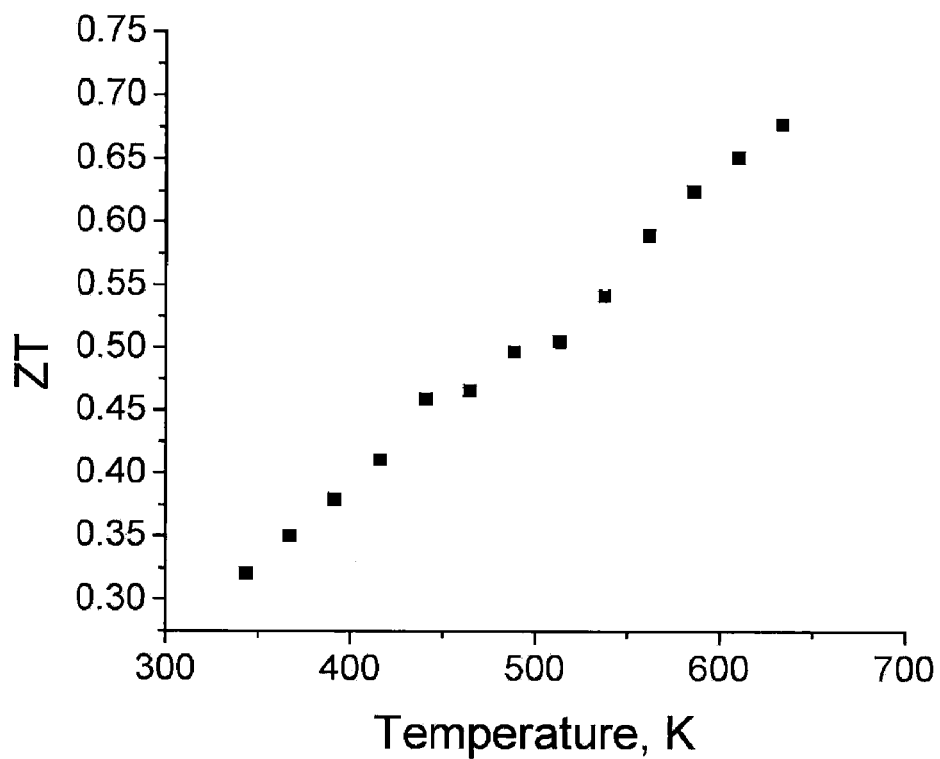

The temperature dependence of the electronic transport was measured for the PbTe—Ge(20%) composite doped with 0.037% $PbI_2$ and is reported in FIG. 4a. The electrical conductivity follows a typical power law dependence of $T^{-2}$. The Seebeck coefficient increased from $-210$ $\mu V/K$ at room temperature to $-310$ $\mu V/K$ at 625K. With increasing temperature the power factor fell from a maximum value at room temperature of 25 $\mu W/cm^2 K$ to a still respectable value of 13 $\mu W/cm^2 K$ at 625K. The lattice thermal conductivity ($\kappa_{lat}$) is shown in FIG. 4c for the PbTe—Ge(20%) sample doped with 0.037% $PbI_2$. Surprisingly the lattice thermal conductivity was very similar to that of PbTe with values of 2.07 W/mK at 328K and 0.89 W/mK at 712K. With the large (20%) amount of second phase Ge the expected lattice thermal conductivity based on the law of mixtures is 2.65 W/mK at 300K. This reduction may be in part due to the "solid solution" behavior displayed through the alloying of GeTe in PbTe as well as the number of interfaces between PbTe and Ge, although the large sizes of the Ge features may be too large to contribute to phonon scattering as in nanostructured materials. Defects in the rapidly quenched PbTe may also play a role in the reduction below the theoretical thermal conductivity. The optimized ZT in these systems reached 0.7 at 675K and was still increasing. This is slightly increased compared to the optimized ZT of conventional PbTe used in industrial applications which has a maximum ZT at 600K. Another remarkable aspect of these materials is the mechanical strength compared to PbTe itself. Qualitatively the improvement was apparent when working with samples for transport measurement. The large number of interfaces in eutectic materials can improve their strength through inhibition of crack propagation. These materials with moderate ZT and improved mechanical strength may find application in certain markets. Further improvement in ZT was accomplished though the reduction of the concentration of high thermal conductivity Ge and through the reduction of the thermal conductivity of Ge through alloying with Si as described below.

Hypereutectic Compositions PbTe—Ge(x %)

The law of mixtures is in part playing a role in the thermal conductivity of the PbTe—Ge system and by reducing the concentration of Ge, thermal conductivity can be reduced and ZT can be increased. Hypereutectic compositions in this system were formed by first precipitating the major phase PbTe while the composition of the liquid phase was continuously enriched in Ge until the eutectic composition was reached. Once the eutectic was reached the rest of the solution solidified as a typical eutectic with PbTe and Ge separating in the solid state. Through microscopic investigation, X-ray diffraction, and thermal and electrical transport measurements these compositions were analyzed for their thermoelectric performance.

Figure 5A:
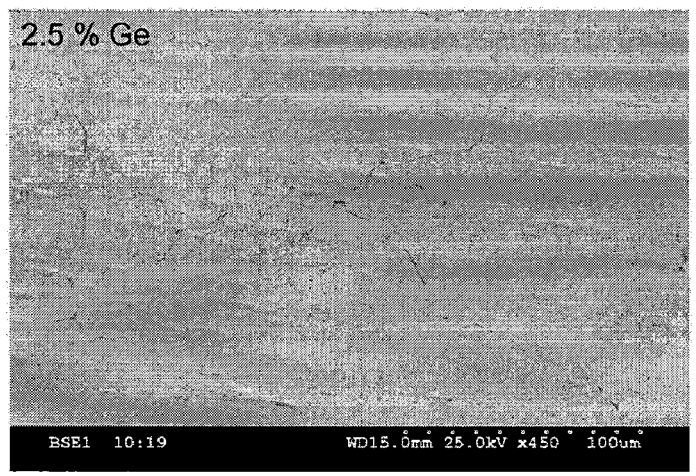
FIG. 5 shows scanning electron micrographs of the hypereutctic compositions (a) PbTe—Ge(2.5%), (b) PbTe—Ge (5%), and (c) PbTe—Ge(10%) showing PbTe grain size dependence on Ge concentration.
Figure 5B:
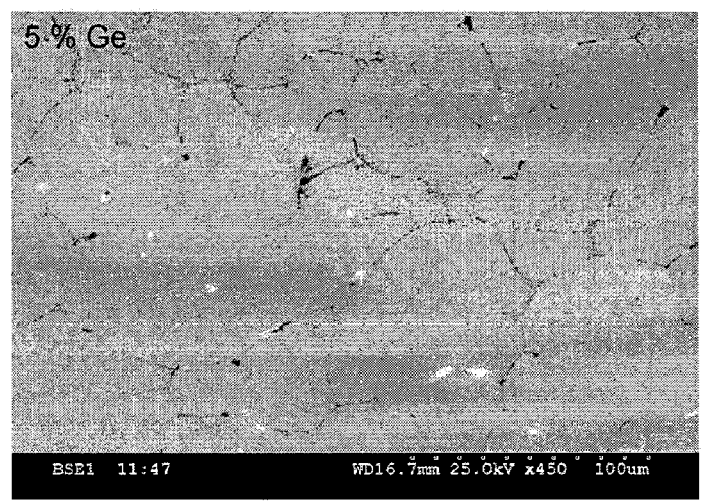
Figure 5C:
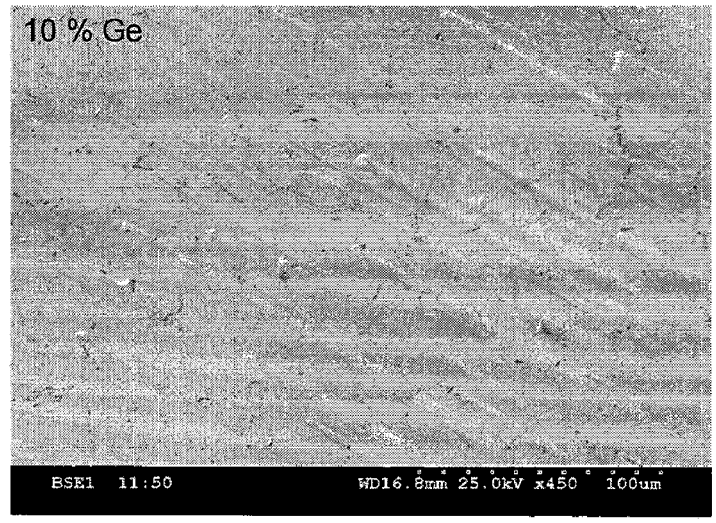

X-ray diffraction experiments for the series of compositions PbTe(Y %)-Ge(X %) with X=2.5, 5, and 10% (Y=97.5, 95, and 90) were conducted. In the series the proportion of Ge that displaces Pb in the PbTe did not scale with the concentration of Ge added and the Pb reflections were readily observed in diffraction experiments even at the 2.5% Ge concentration. Scanning electron microscopy was used to further characterize these samples. Micrographs of the material (FIG. 5) revealed larger grains of PbTe separated by smaller regions of the eutectic PbTe(80%)-Ge(20%) for the hypereutectic compositions. In FIGS. 5a-c a magnification of 450× was used for direct comparison between the compositions. For the 2.5% sample grains of PbTe were on the order of several hundred microns while the grains in the 5% and 10% samples were ~100 μm and ~50 μm respectively. The eutectic precipitated between the grains remained similar to that of the PbTe—Ge(20%) sample with rod-like features of Ge on the order of several hundred nanometers in diameter and lengths on the micron scale. Light scratches were observed as an artifact of polishing and are not attributed to the samples.

The thermal conductivity of these samples was measured as a function of Ge content. As shown in FIG. 6, the lattice thermal conductivity decreased as the concentration of Ge decreased in the composite. The 5% sample had the lowest thermal conductivity of the series with a lattice thermal conductivity of 1.5 W/mK and 1.1 W/mK at 300K and 600K respectively. This was significantly reduced from the parent PbTe phase at room temperature. Improved properties were obtained in these samples, however further enhancements in ZT were realized in samples with Ge alloyed with Si as described below.

PbTe(80%)-$Ge_{(1-x)}Si_x$(20%)

Alloys of Si and Ge provide significantly reduced thermal conductivity compared to either of the end members of the solid solution. This gives the ability to further reduce the thermal conductivity of the Ge-containing minor phase in the compositions. Alloys of Ge and Si rich in Ge were prepared for investigation as the second phase in PbTe(80%)-$Ge_{(1-x)}Si_x$(20%) compositions. This yielded samples with PbTe and $Ge_{(1-x)}Si_x$ phases separated in the solid state. The eutectic point in these samples was similar to that of the Ge only composition near 20% and in these sample Ge again displaced Pb and gave rise to additional Pb reflections observed by powder X-ray diffraction in addition to the PbTe and $Ge_{(1-x)}Si_x$ phases.

The thermal conductivity was measured with respect to various solid solutions of Ge and Si. The lattice thermal conductivity is plotted as a function of temperature in FIG. 6b. The results showed that the thermal conductivity was reduced through alloying in the minority Ge phase and reached a minimum at the $Ge_{0.8}Si_{0.2}$ composition. Further increase of the Si dopant in Ge did not result in a further decrease in thermal conductivity in the eutectic composite. In the $Ge_{(1-x)}Si_x$ solid solution itself the thermal conductivity reaches a minimum at the $Ge_{0.8}Si_{0.2}$ composition as well. When the $Ge_{0.8}Si_{0.2}$ alloy is used for the hypereutectic reactions a significant reduction from the already reduced thermal conductivity in either the alloy $Ge_{(1-x)}Si_x$ samples or the hypereutectic samples with Ge alone may be achieved, as described below.

PbTe—$Ge_{0.8}Si_{0.2}$(x %)

Figure 6A:
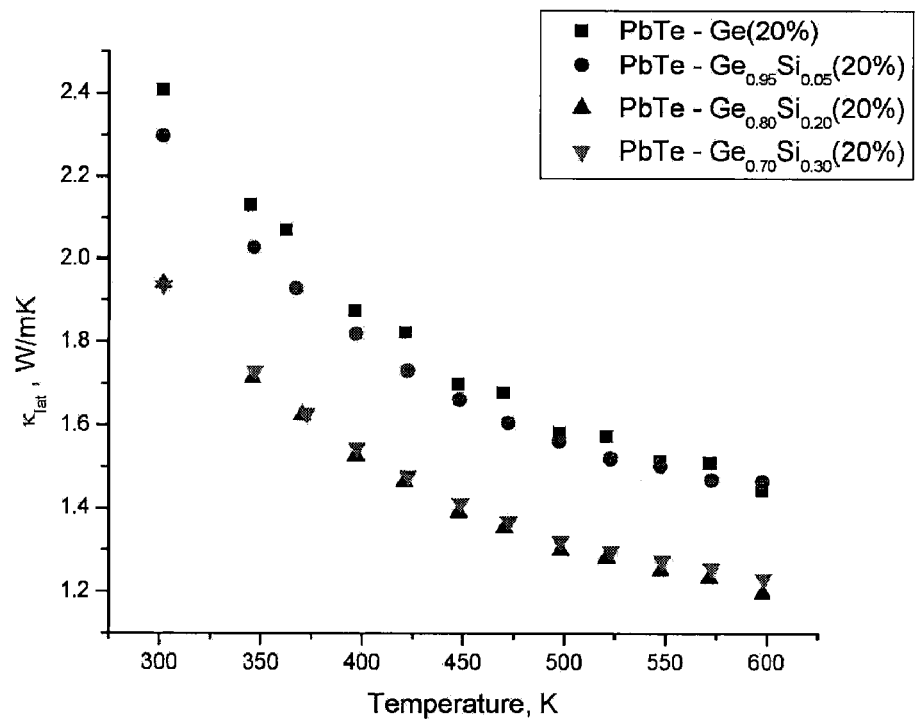
FIG. 6 shows the temperature dependent lattice thermal conductivity of (a) PbTe—Ge$_{(1-x)}$Si$_x$(20%), (b) hypereutectic compositions of PbTe—Ge(X %), (c) hypereutectic compositions of PbTe—Ge$_{0.8}$Si$_{0.2}$(X %), and (d) a summary of room temperature lattice thermal conductivities.
Figure 6B:
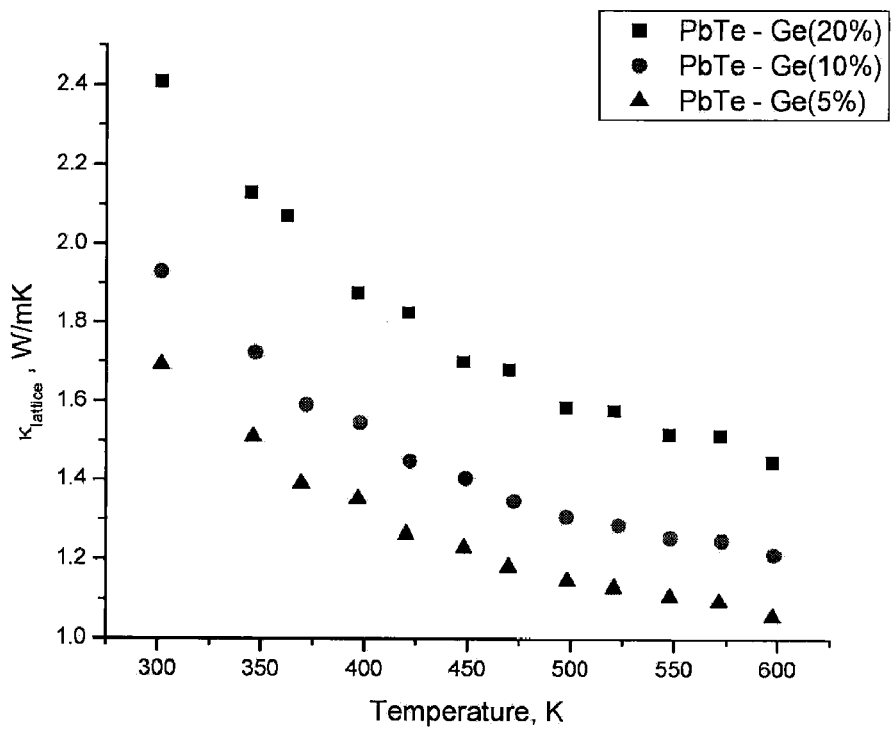
Figure 6C:
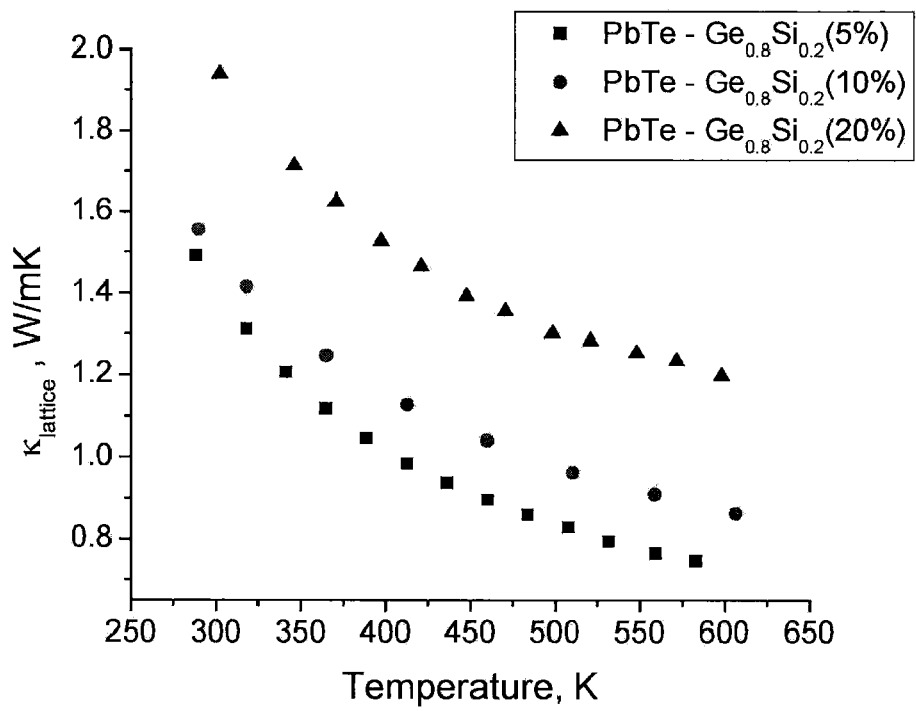
Figure 6D:
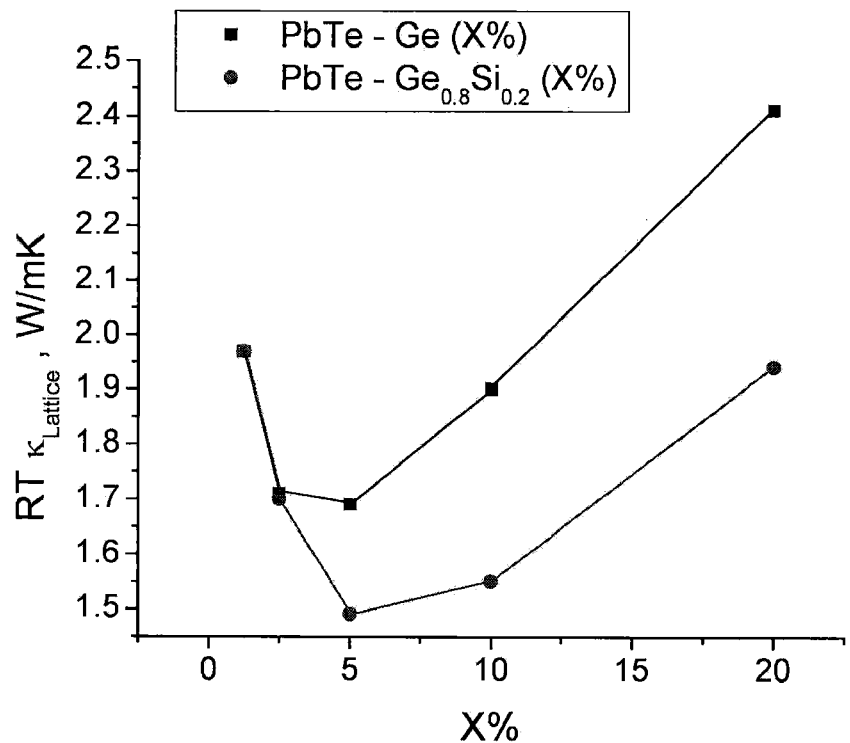
Figure 7A:
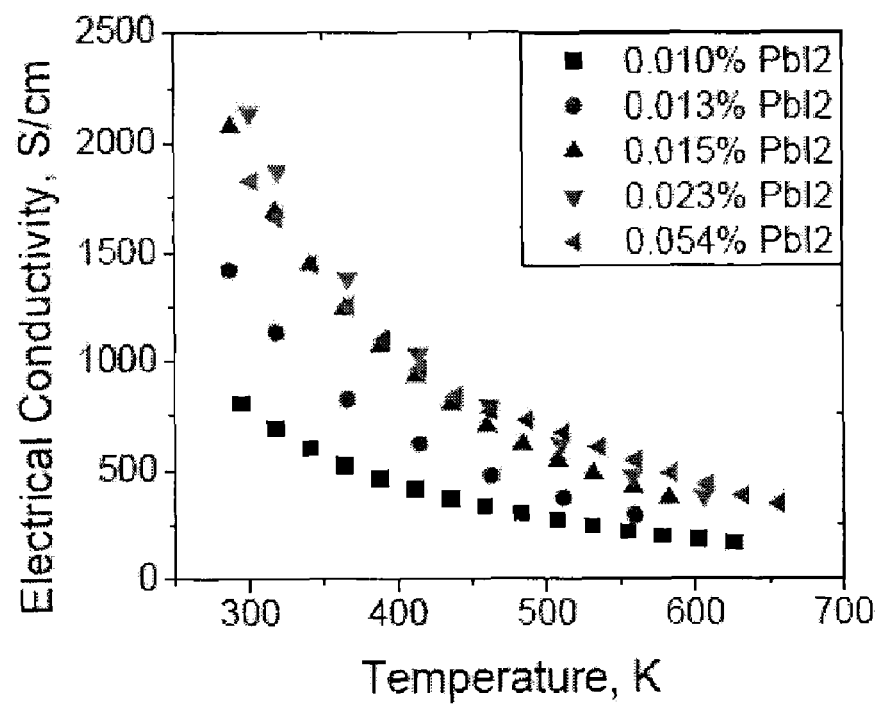
FIG. 7 shows the temperature dependent thermoelectric properties of PbTe—Ge$_{0.8}$Si$_{0.2}$(5%) doped with various amounts of PbI$_2$ to increase the carrier concentration: (a) electrical conductivity increased with additional PbI$_2$, (b) Seebeck coefficient decreased with addition of PbI$_2$, (c) power factor reaches a maximum for PbTe—Ge$_{0.8}$Si$_{0.2}$(5%) doped with 0.015% PbI$_2$, and (d) ZT achieves a value of 1.3 at 778K.
Figure 7B:
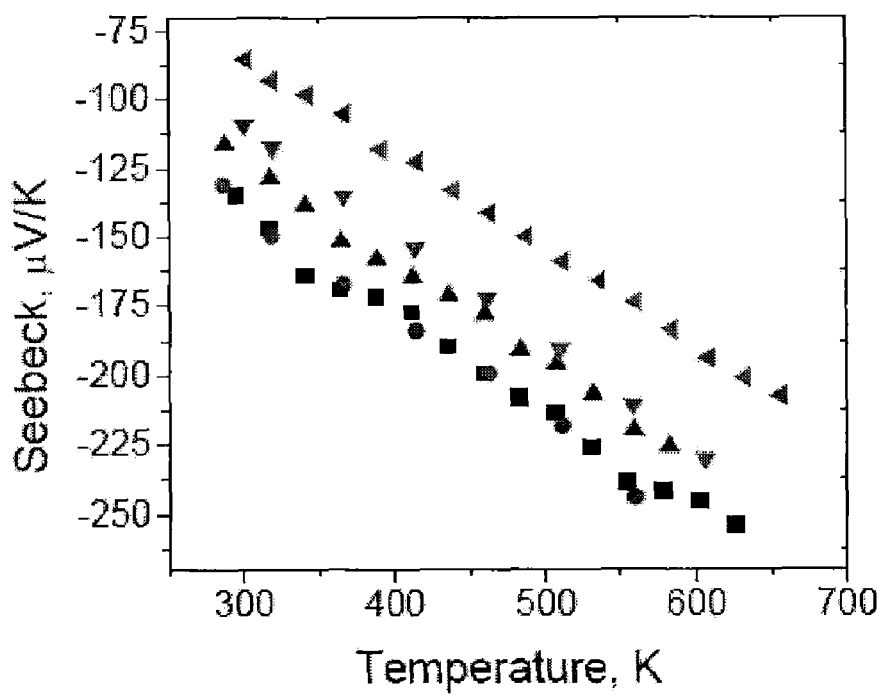
Figure 7C:
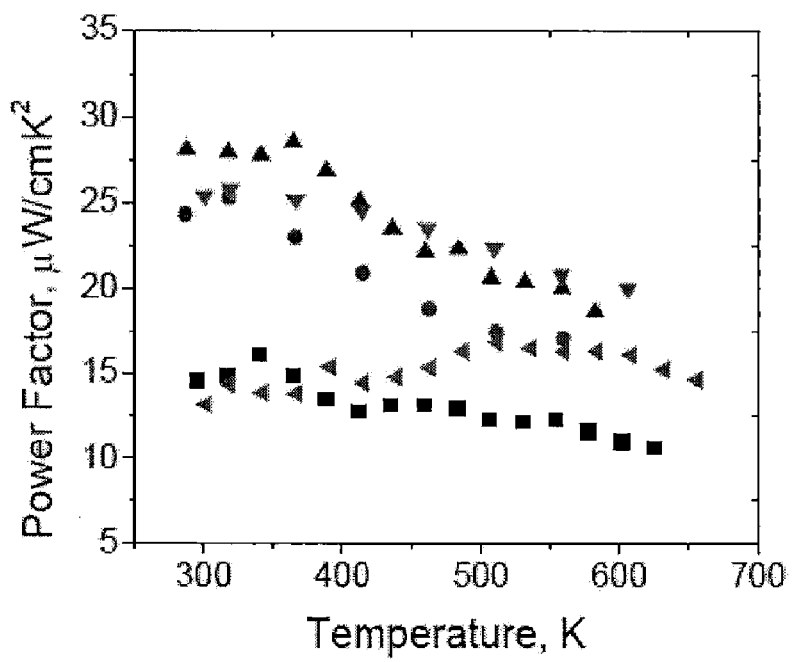
Figure 7D:
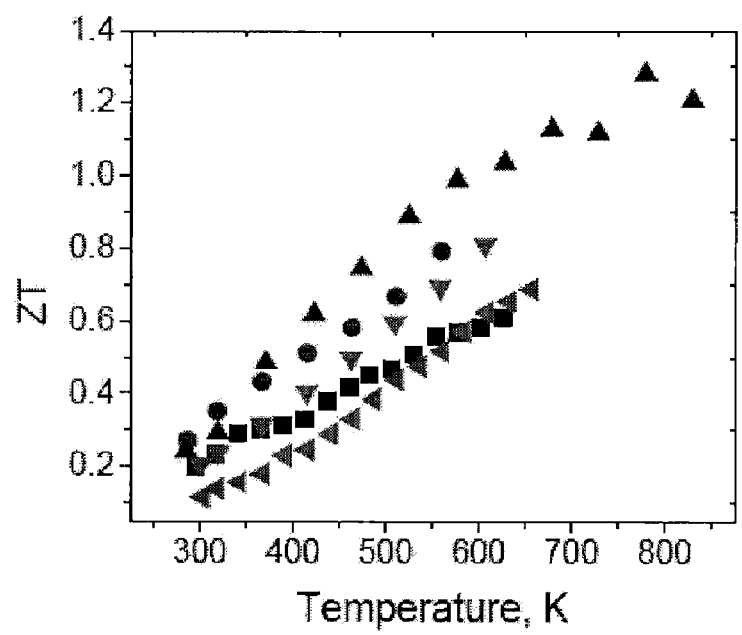

The results for the PbTe—$Ge_{(1-x)}Si_x$ compositions and the reduced thermal conductivity in the PbTe—Ge hypereutectic samples indicated that the thermal conductivity of PbTe—$Ge_{0.8}Si_{0.2}$ hypereutectics could also be reduced relative to the pure Ge(20%) or the hypereutectic samples prepared previously. These compositions were prepared using $Ge_{0.8}Si_{0.2}$ and PbTe in various off-eutectic compositions. Similar powder X-ray diffraction results were obtained in these samples, with the only observed phases being PbTe, $Ge_{0.8}Si_{0.2}$, and Pb metal. The use of the Ge and Si alloy combined with the reduced concentration of second phase in the hypereutectic resulted in significant reductions of the lattice thermal conductivities as shown in FIG. 6c. For the PbTe—$Ge_{0.8}Si_{0.2}$(x %) composition the thermal conductivity was reduced as the concentration of $Ge_{0.8}Si_{0.2}$ was decreased. The lowest thermal conductivity was obtained for the PbTe—$Ge_{0.8}Si_{0.2}$(5%) sample with a room temperature lattice thermal conductivity of 1.49 W/mK at 300K and 0.74 W/mK at 600K. These values represent a ~30-35% reduction of the lattice thermal conductivity with respect to pristine PbTe over the measured temperature range. The room temperature lattice thermal conductivity for the various hypereutectic and alloyed samples are shown in FIG. 6d for comparison. In both the PbTe—Ge(x %) and the PbTe—$Ge_{0.8}Si_{0.2}$(x %) samples a minimum in the thermal conductivity occurred at 5% second phase. Below this composition the lattice thermal conductivity increased to values close to those expected for pristine PbTe.

Once the lattice thermal conductivity was minimized, samples of PbTe—$Ge_{0.8}Si_{0.2}$(5%) were prepared with various amounts of $PbI_2$ to optimize the electrical transport. The resulting temperature dependent electrical conductivity, Seebeck coefficient, power factor, and resulting ZT are shown in FIG. 7. The electrical conductivity followed the expected behavior, increasing monotonically as the $PbI_2$ concentration increased from 0.010% to 0.015%. As the concentration of $PbI_2$ increased above the 0.015% level the electrical conductivity no longer increased. The Seebeck coefficient follows the opposite trend, decreasing in magnitude from $-130$ µV/K to $-80$ µV/K at room temperature as the $PbI_2$ concentration increased. In all of the cases the Seebeck coefficient increased linearly with increasing temperature. The highest power factor of 28 $\mu W/cmK^2$ was measured for the PbTe—$Ge_{0.8}Si_{0.2}$ (5%) sample doped with 0.015% $PbI_2$. This power factor decreased with increasing temperature, but still remained high at 778K with a value of 14.7 $\mu W/cmK^2$. This large power factor combined with the reduced thermal conductivity in the PbTe(95%)-$Ge_{0.80}Si_{0.200}$(5%) composite results in a ZT of 1.3 at 778K.

Example 2

PbTe—Si System

This example reports the microstructure and thermoelectric properties of the PbTe—Si(8%) system. Compared to the PbTe—Ge system, the eutectic point in this system occurs at a lower percentage of the minor phase (8% vs 20%), and occurs at a higher temperature (900° C. vs 865° C.). (See Burmistrova, N. P.; Fitseva, R. G.; Faizullina, N. R.; Mullina, V. A., *Izvestiya Akademii Nauk SSSR, Neorganicheskie Materialy* 1982, 18 (5), 876-7 and Odin, I. N., *Zh. Neorg. Khim.* 1994, 39 (10), 1730-3.) The low concentration of silicon as well as its lower cost compared to Ge make this eutectic attractive as a thermoelectric. The carrier concentration, and therefore the Seebeck coefficient and electrical conductivity, was precisely controlled by doping with $PbI_2$. The electron mobility of the PbTe—Si(8%) samples was high (~1000 $cm^2$/Vs) and was not significantly reduced from that of pure PbTe by the Si precipitates. A complex micro- and nanostructure contribute to an increase in the mechanical strength compared to PbTe itself without significantly affecting the lattice thermal conductivity. Rather, the latter follows closely with the expected value for PbTe. ZT values comparable to PbTe were obtained with the benefit of having a rapidly prepared material and improved mechanical strength. The high temperature Lorenz number was determined to be 45% of the Lorenz number for metals ($L_0$). The mechanical robustness of the samples, the rapid synthesis, and the moderate ZT of these materials makes them attractive for module fabrication.

Experimental:

Synthesis

Lead (Rotometals, 99.99%) and Tellurium (Atlantic Metals, 99.999%) were combined in a 1:1 ratio in 24.5 mm diameter fused silica tubes, sealed under vacuum, and heated to 1000° C. For example, approximately 250 g of pure PbTe was prepared by quenching the resulting melt of Pb (149.4931 g, 0.7215 mol) and Te (92.0629 g, 0.7215 mol) in a room temperature water bath.

The resulting PbTe, Si (Cerac, 99.992%), and $PbI_2$ (Aldrich, 99.999%) were combined in the appropriate molar ratio in quartz tubes (8 mm ID) and sealed under vacuum. For example, 9.1623 g (0.0273 mol) of PbTe, 0.0672 g (0.0023 mol) Si, and 0.0016 g ($3.47 \times 10^{-6}$ mol) of $PbI_2$ were used to prepare the PbTe—Si(8%) sample doped with 0.0127% $PbI_2$. The material was then heated to 1050° C. and allowed to homogenize in the melt for 12 h. The liquid was then rapidly cooled in a room temperature water bath.

The resulting ingots (8 mm diameter) were cut using a diamond blade saw into several pieces for electrical, thermal and microstructural characterization. First a coin 8 mm in diameter and 2 mm thick was cut for thermal diffusivity measurements. The faces of the coin were polished to insure they were parallel using 800 grit sandpaper. Adjacent to this coin a ~10 mm long cylinder was cut from which two samples were prepared. One ~3×3×10 mm and one 1×3×8 mm sample were prepared for electrical transport measurements and Hall effect measurement respectively. These samples were cut using the diamond saw and polished using 800 grit sandpaper to provide the parallelepipeds necessary for measurements. All transport measurements were conducted in the same direction along the length of the ingot.

Powder X-ray Diffraction

Powder X-ray diffraction experiments were performed on finely ground powders using an Inel diffractometer (Cu $K_\alpha$ radiation) operating at 40 kV/20 mA.

Electron Microscopy

Scanning electron microscopy was performed on highly polished samples using a Hitachi S3400 and S4800 with varying accelerating voltage for imaging and a 20 kV accelerating voltage for energy dispersive spectroscopy measurements.

Samples for transmission electron microscopy were prepared by conventional techniques of thinning, dimpling, and ion milling to obtain thin samples for analysis, as described previously in Example 1. Microscopy was performed using a JEOL 2100 transmission electron microscope operating at a 200 keV accelerating voltage. Self-consistent ab initio multiple-scattering calculations for electron energy loss spectroscopy (EELS) were performed using the FEFF8.4 code to determine the energy loss spectrum of oxygen in $SiO_2$. (See Ankudinov, A. L.; Ravel, B.; Rehr, J. J.; Conradson, S. D., *Phys. Rev. B: Condens. Matter Mater. Phys.* 1998, 58 (12), 7565-7576.)

Electrical Transport Characterization

Temperature dependent electrical conductivity and Seebeck coefficient measurements were performed using a ULVAC Technologies ZEM3. The electrical conductivity was determined using a 4-probe method with spring loaded current contacts. Type R thermocouples doubled as both voltage leads and were used for measurement of temperature during Seebeck coefficient measurement. For the Seebeck measurements, temperature gradients of 5, 10, and 15° were used and the corresponding voltage differences and temperature differences were then averaged. A temperature stability of 0.25° was used over the course of the measurement at each temperature step.

High temperature (300-750K) Hall effect measurements were performed on samples ~1×3×8 mm in size with forced contacts. The measurements were performed in a home made apparatus under Ar atmosphere utilizing an Oxford Superconducting Magnet with constant magnetic field of ±1 Tesla. The Hall resistance was monitored with a Linear Research AC Resistance Bridge (LR-700).

Thermal Conductivity/Diffusivity Characterization

A Netzsch LFA-457 was used to measure temperature dependent thermal diffusivity and heat capacity in the temperature range 300-700 K. Coins 12.7 mm in diameter and 2-2.5 mm thick were used in all measurements and the thermal conductivity in these samples was determined using the laser flash diffusivity heat capacity method from 300 to 700 K. The diffusivity (D), density ($\rho$), and specific heat ($C_p$) were measured and used to calculate the total thermal conductivity using the formula $\kappa = D\rho C_p$.

Figure 8A:
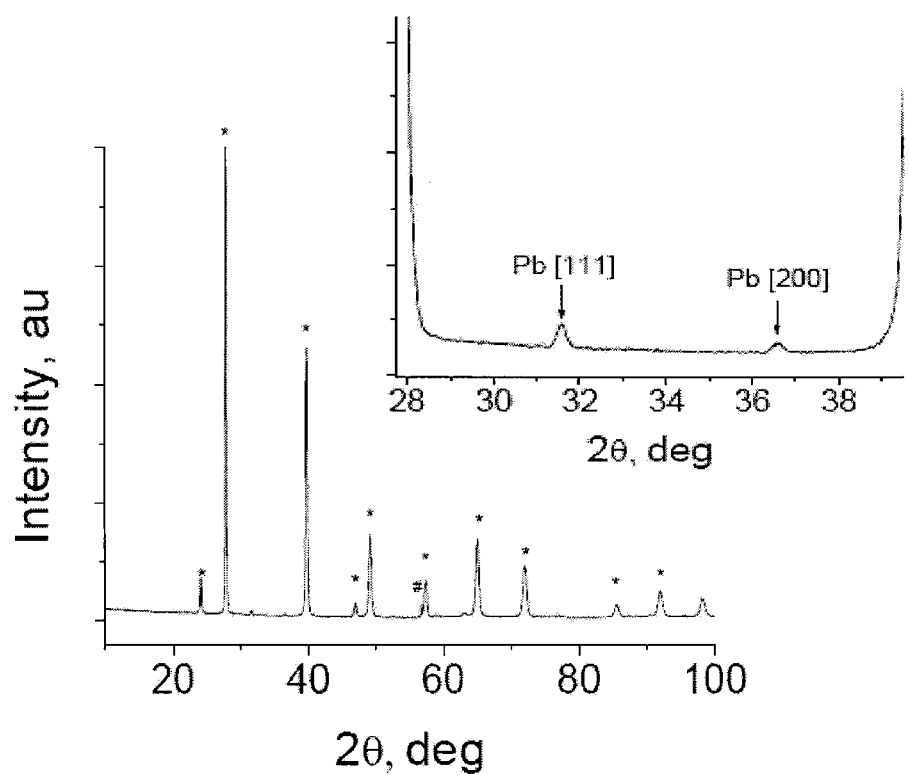
FIG. 8 (a) shows the powder X-ray diffraction showing the major PbTe (* symbols) and Si reflection (# symbol) and the minor phase Pb precipitates (inset), (b) Heating and cooling differential thermal analysis curves indicating melting and recrystallization at ~927° C., and (c) Infrared absorption curve for PbTe—Si(8%) showing the E$_g$ of 0.27 eV comparable to PbTe itself.
Figure 8B:
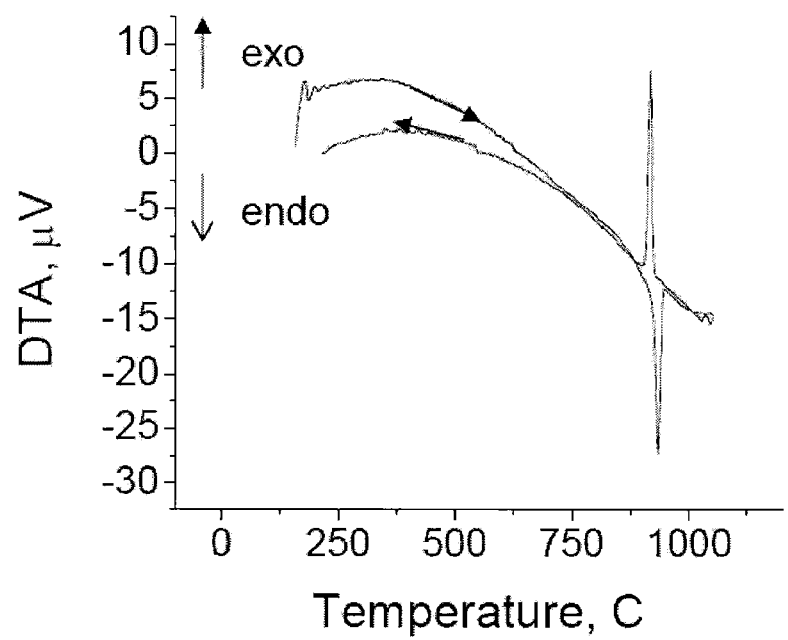
Figure 8C:
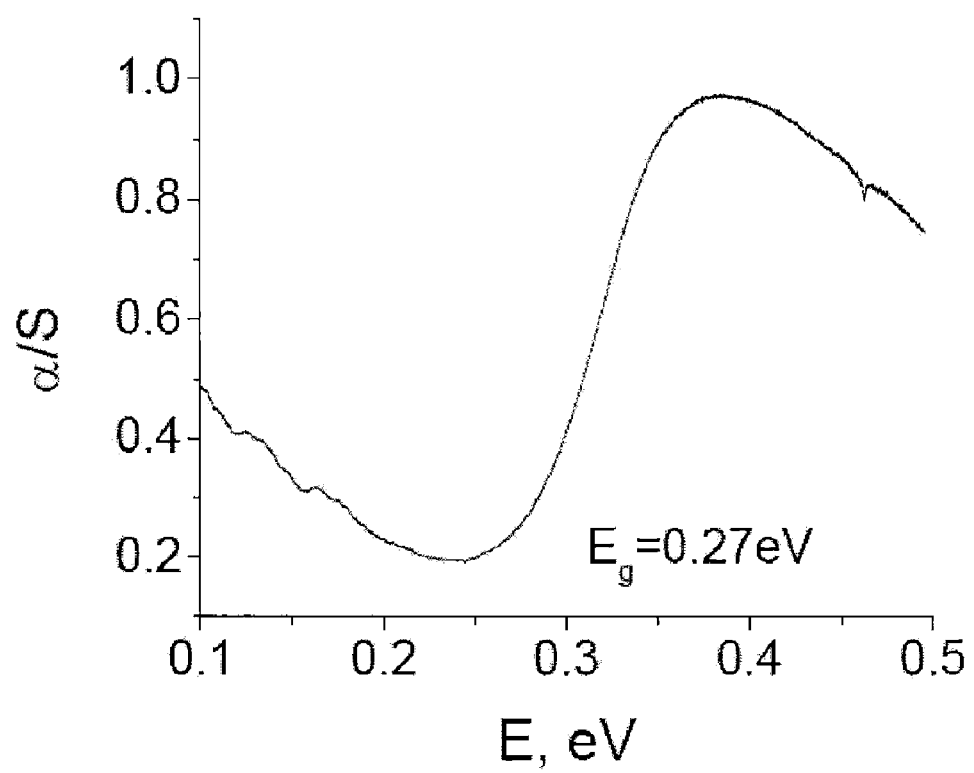

Results and Discussion:

Synthesis and Mircostructural Characterization 10 g ingots were rapidly prepared by heating PbTe and Si in the appropriate ratios in fused silica ampoules under vacuum to 1050° C. overnight. The samples were then rapidly solidified by removing the ampoules from the furnace and placing in a room temperature water bath. Powder X-ray diffraction (PXRD) results indicate the presence of PbTe and Si phases in the samples, however additional peaks were observed for Pb metal (FIG. 8). In several samples a broad amorphous reflection was also observed via powder X-ray diffraction. This amorphous region originates from the amorphous regions at the interface of the PbTe and Si precipitates as observed via transmission electron microscopy. Analysis of PbTe—Si (8%) by differential thermal analysis showed melting and crystallization transitions at 927° C. slightly higher than the published phase diagram (900° C.) (FIG. 8*b*). (See Odin, I. N., *Zh. Neorg. Khim.* 1994, 39 (10), 1730-3.) The band gap of the composite was measured to be 0.27 eV, comparable to that of PbTe itself (FIG. 8*c*).

Figure 9A:
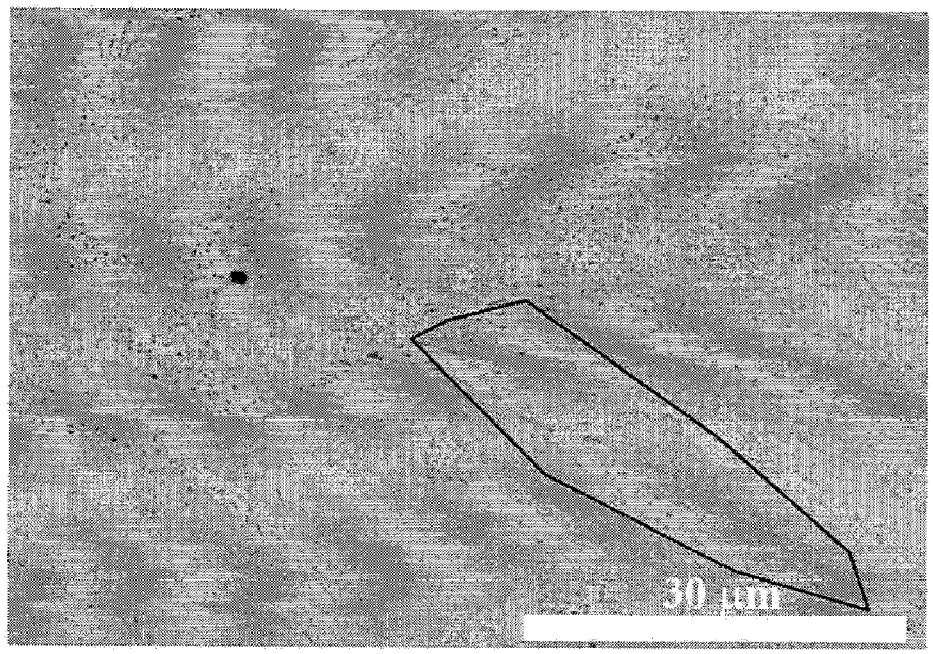
FIG. 9A shows a scanning electron micrograph& of PbTe-Si(8%) indicating the rodlike morphology of the Si precipitates (~40-200 nm) in diameter. The outlined region distinguishes precipitates observed perpendicular to the smaller diameter.
Figure 9B:
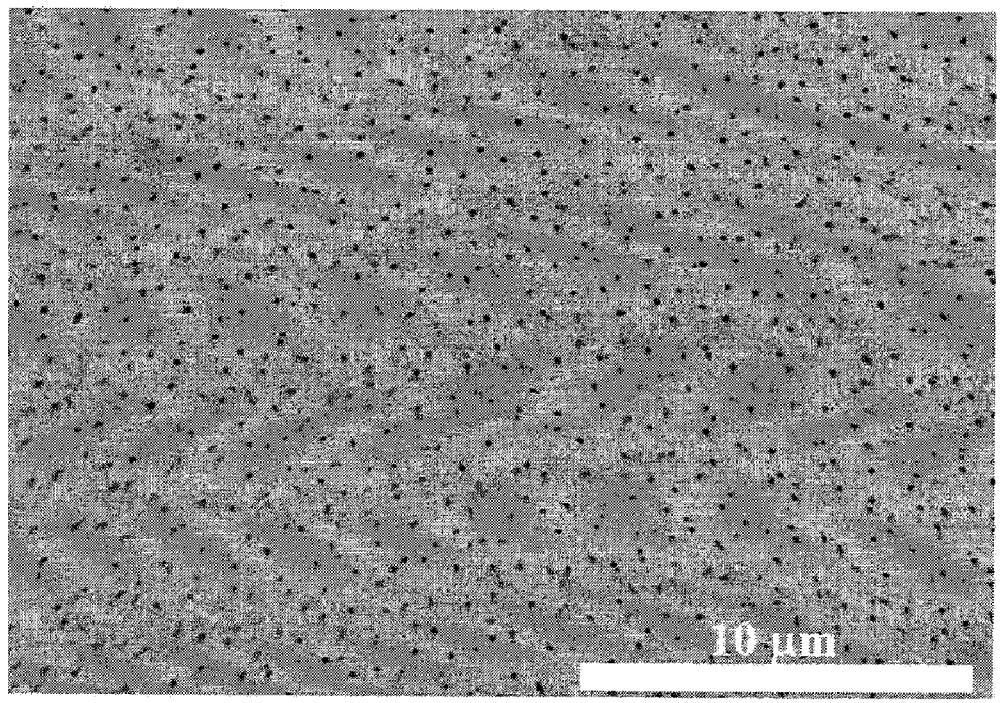
FIG. 9B shows a more enlarged scanning electron micrograph of the PbTe-Si(8%).

Scanning electron microscopy was used to analyze the microstructure of the composite eutectic. Silicon precipitates were observed throughout regions of PbTe, (FIGS. 9*a-b*). These rod-like precipitates, approximately 40-250 nm in diameter, appear to be several microns in length. The precipitates of Si, were generally smaller than those observed in the PbTe—Ge system described in Example 1 (Ge precipitates tend to be several microns in diameter), and suggest that the crystallization of the PbTe—Si eutectic during quenching occurs faster and does not allow for the Si to migrate through the sample to form larger precipitates. Traces of Pb metal were observed via PXRD and in scanning electron microscopy as ~20 μm precipitates, although these precipitates were very few in number and separated from each other.

Investigation by transmission electron microscopy (TEM) identified additional Pb precipitates of 2-20 nm in diameter located in the PbTe domains of the samples. TEM revealed that within the material, several regions exist including the PbTe matrix with Si precipitates, PbTe with Pb nanoprecipitates, and a boundary layer between the matrix and Si. The Si precipitates were observed as light colored regions (~80-150 nm) in the bright field image due to their significantly lower atomic number compared to PbTe. The boundary layer between the Si precipitates and the PbTe matrix (~2-5 nm thickness) is discussed in greater detail below. The Pb nanoprecipitates (~2-20 nm) have a darker contrast than the matrix PbTe and are likely responsible for the additional reflections observed via selected area electron diffraction. The Pb nanoprecipitates are likely the result of Si replacing Pb to form $Si_2Te_3$ at the interface between the PbTe and Si according to Eq. 4.

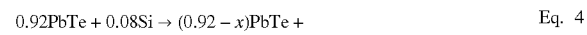
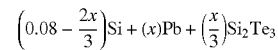

$$0.92 PbTe + 0.08 Si \rightarrow (0.92 - x) PbTe + \left(0.08 - \frac{2x}{3}\right) Si + (x) Pb + \left(\frac{x}{3}\right) Si_2 Te_3 \quad \text{Eq. 4}$$

In contrast to the Ge system, where a stable $Pb_{1-x}Ge_xTe$ solid solution formed, there is little solubility of Si in PbTe and the resulting Si—Te phase was trapped at interparticle boundaries. The only known Si—Te compound is $Si_2Te_3$ and this compound is likely present at the boundaries between Si and PbTe, as $Si_2Te_3$ has limited solubility in either PbTe or Si. (See Odin, I. N., *Zh. Neorg. Khim.* 1994, 39 (10), 1730-3.) This boundary phase may decompose upon exposure to water during sample preparation and appear as an amorphous layer at the surface of Si precipitates embedded in the PbTe matrix. At the surface of the silicon precipitates the crystalline $Si_2Te_3$ was readily hydrolyzed upon exposure to water during sample preparation forming amorphous $SiO_2$ and $H_2Te$. The presence of oxygen at this amorphous boundary was confirmed using EELS measurements. The results of the EELS calculations confirmed the two oxygen peaks both came from SiO2. It is likely that this $Si_2Te_3$, when embedded in the bulk material, is stable and may act as an interface to allow charge transport between the PbTe and Si.

Electrical and Thermal Transport Characterization

Figure 10A:
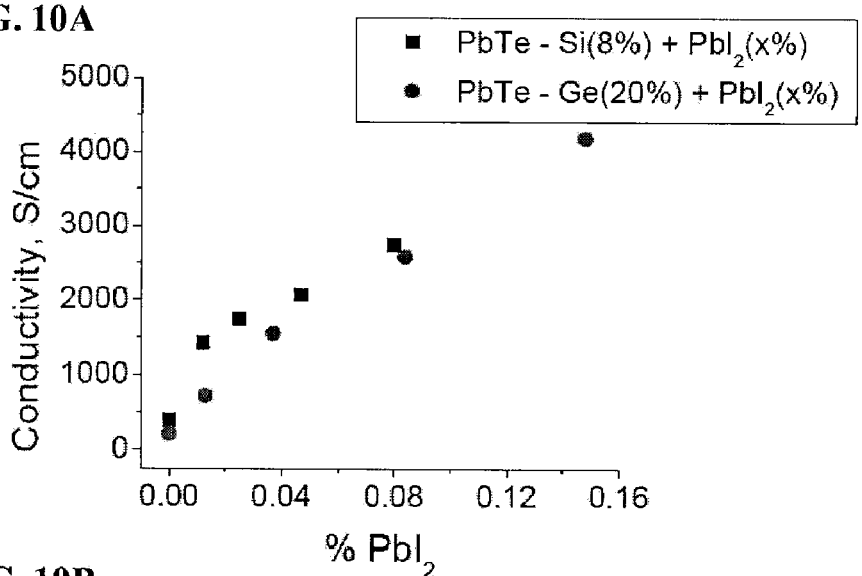
FIG. 10 shows a comparison of the room temperature (a) electrical conductivity, (b) Seebeck coefficient, and (c) power factor for the PbI$_2$ doped eutectic materials PbTe—Ge (20%) and PbTe—Si (8%).
Figure 10B:
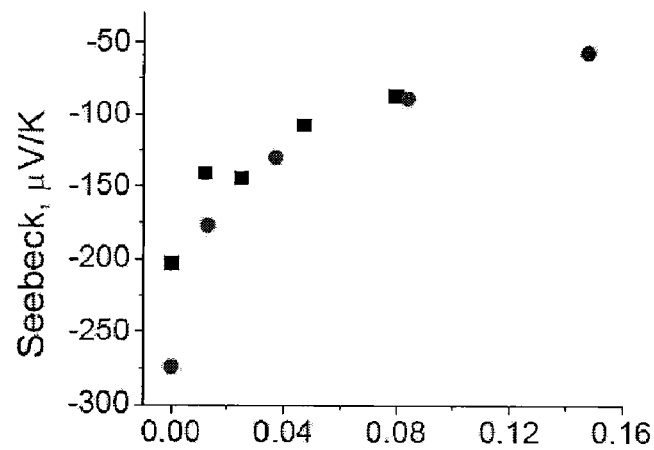
Figure 10C:
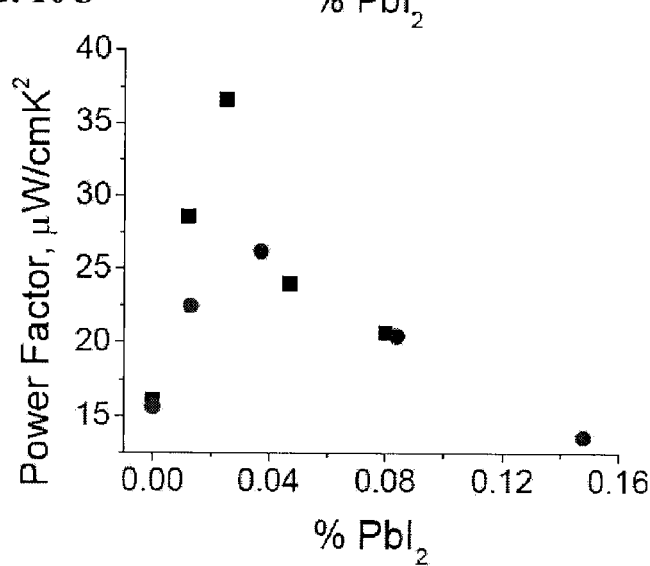

Room temperature electrical conductivity and Seebeck coefficient measurement results are summarized for a series of PbTe—Si(8%) doped with $PbI_2$ in FIG. 10. The electrical conductivity increased monotonically with $PbI_2$ concentration as expected for a rising carrier concentration. At room temperature the electrical conductivity was 390 S/cm for the sample without $PbI_2$ and it increased linearly to 2750 S/cm for the sample doped with 0.08 mol % $PbI_2$. The corresponding Seebeck coefficient was negative (n-type) and decreased from −200 μV/K to −80 μV/K for the same $PbI_2$ concentrations. A large power factor at room temperature (~36 μW/cmK²) was obtained for the optimized carrier concentration of $7.71 \times 10^{18}$ cm$^{-3}$ in the 0.025% $PbI_2$ doped sample.

Temperature dependent electrical conductivity, Seebeck coefficient, power factor, and lattice thermal conductivity for a series of $PbI_2$ doped PbTe—Si(8%) materials are shown in FIG. 11. All samples showed a decreasing electrical conductivity with increasing temperature consistent with the Seebeck coefficient increased in magnitude with rising temperature. For certain doping concentrations the Seebeck coefficient reached ~−300 μV/K at temperatures >650 K. This behavior is comparable to pure n-type PbTe. (See Dughaish, Z. H., *Physica B. Condensed Matter (Amsterdam, Netherlands)* 2002, 322 (1-2), 205-223.) The power factor remained high (>15 μW/cmK²) at these temperatures and contributed to the moderate ZT observed.

Figure 11A:
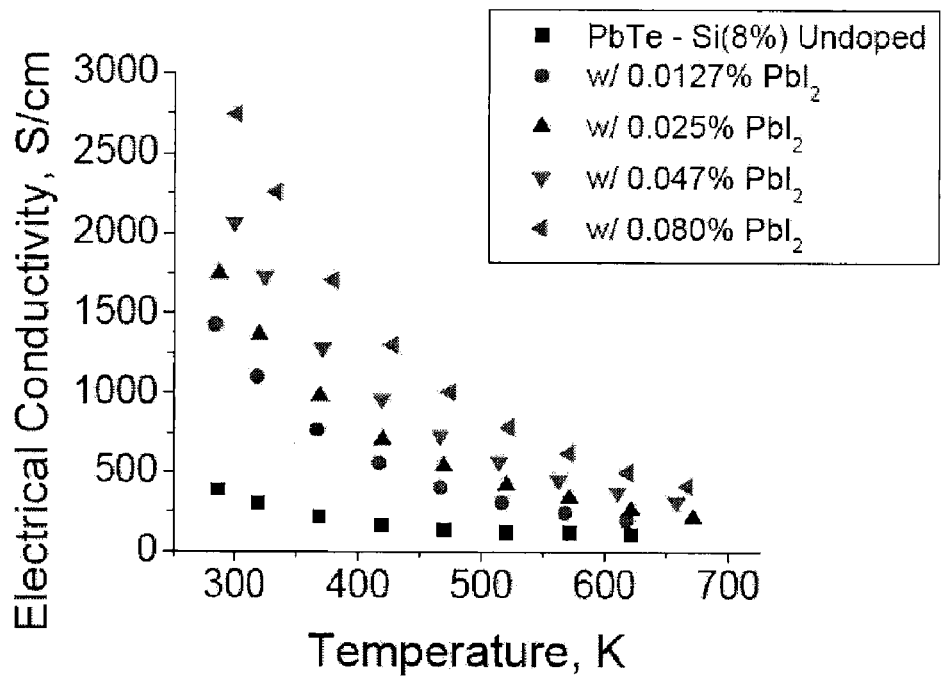
FIG. 11 shows the temperature-dependent (a) electrical conductivity, (b) Seebeck coefficient, (c) power factor, and (d) lattice thermal conductivity for a series of PbTe—Si (8%) compositions doped with PbI$_2$.
Figure 11B:
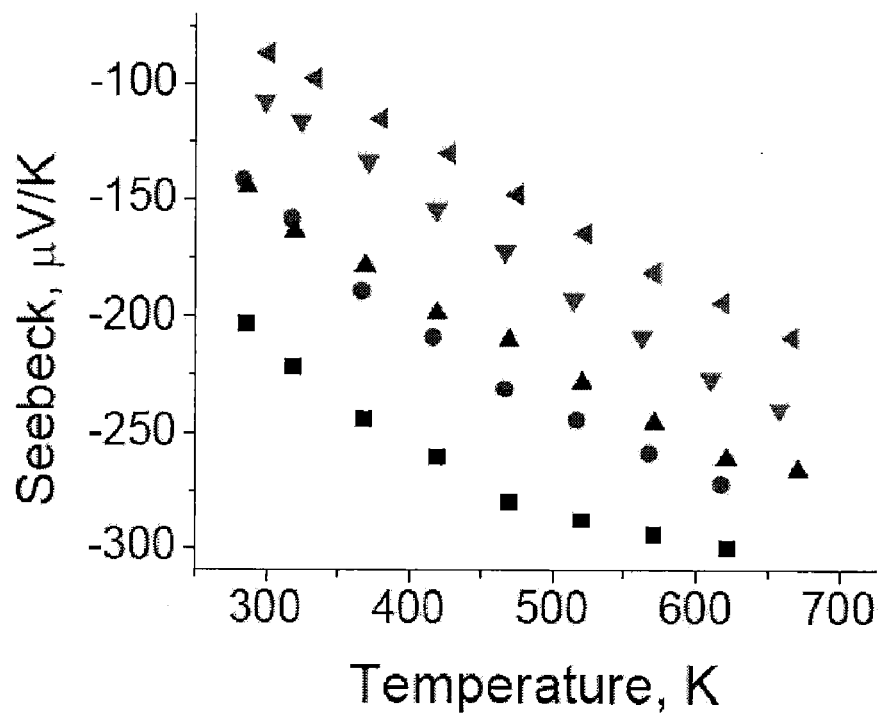
Figure 11C:
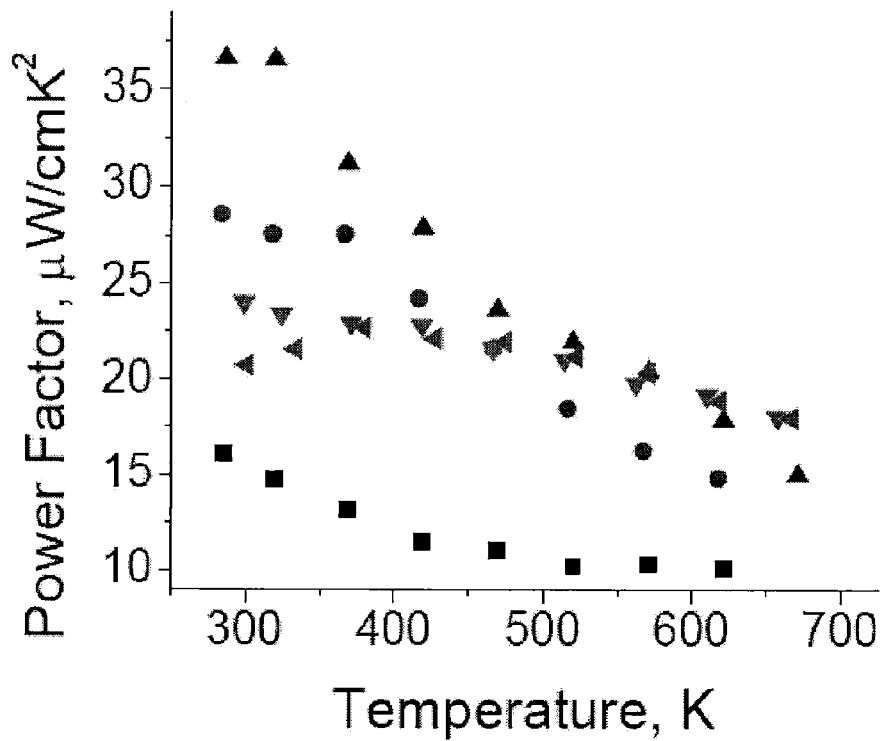
Figure 11D:
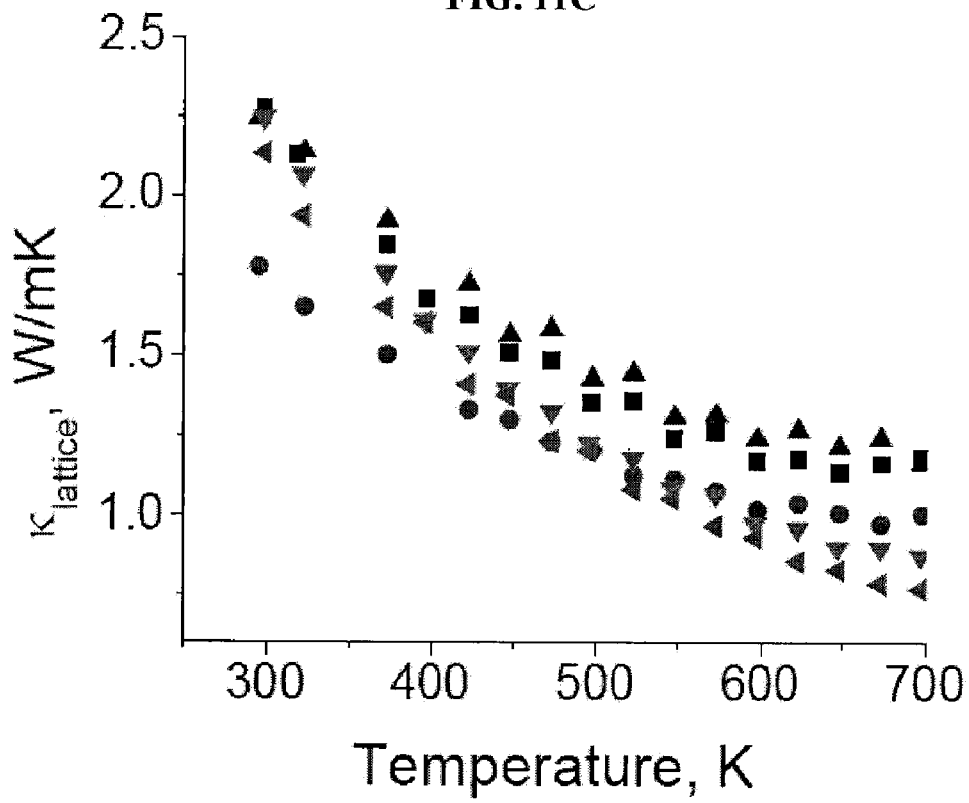

Generally, the thermal conductivity is comprised of two components: the lattice and electronic thermal conductivity ($\kappa_{tot} = \kappa_{lat} + \kappa_{elec}$). According to the Widemann Franz law the electronic component is calculated to be $\kappa_{elec} = L\sigma T$ where L is the Lorenz number, σ the electrical conductivity, and T the temperature. (See Kittel, C., *Introduction to Solid State Physics*. 8th Edition ed.; John Wiley & Sons: 2005.) Initially, the electronic thermal conductivity was calculated using the Lorenz number for metals and heavily degenerate semiconductors ($L_o = 2.45 \times 10^{-8}$ WΩ/K²). When this method was used, a wide range of the lattice thermal conductivity values from 0.7 W/mK to 1.2 W/mK at high temperatures were calculated (FIG. 11d). This result was unexpected as there were only small differences in the $PbI_2$ dopant concentration that would not account for the large change in lattice thermal conductivity observed. This suggested that the assumption that L is constant with temperature is incorrect.

In order to estimate a more correct Lorenz number and better determine the lattice thermal conductivity in these materials, the total thermal conductivity was plotted as a function of σT. From this, $\kappa_{tot}=\kappa_{lat}+L\sigma T$ was fit and the lattice thermal conductivity and L were extracted from the intercept and the slope of the linear fit. This procedure was repeated for several temperatures between 300 and 700K using the same linear fit to approximate the Lorenz number and lattice thermal conductivity at each temperature. The Lorenz number determined in this manner can be shown as a ratio with $L_o$. At 300K the ratio was close to 1 indicating that the material can be described by the Widemann Franz law using the Lorenz number for metals. At high temperatures a significant deviation from $L_0$ is observed which shows that the lattice thermal conductivity is greatly underestimated when a Lorenz number of $2.45 \times 10^{-8}$ W$\Omega$/K$^2$ is used. In this crude approximation several neglected effects are neglected, however it is apparent that in many PbTe-based materials using $L_0$ in calculations can lead to greatly underestimated lattice thermal conductivity values. Regardless of the lattice thermal conductivity calculated, the value of the total thermal conductivity is a measured quantity and is used in the calculation of ZT.

The lattice thermal conductivity obtained from these fits indicated that the lattice thermal conductivity follows closely the expected values for PbTe itself (see Dughaish, Z. H., *Physica B: Condensed Matter (Amsterdam, Netherlands)* 2002, 322 (1-2), 205-223) and follows the 1/T dependence predicted from theory. (See Keyes, R. W., *Phys. Rev.* 1959, 115, 564-567.) In the PbTe—Si (8%) samples the expected lattice thermal conductivity of the composite was 2.36 W/mK at room temperature as calculated by effective medium theory. (See Wang, J.; Carson, J. K.; North, M. F.; Cleland, D. J., *International Journal of Heat and Mass Transfer* 2008, 51 (9-10), 2389-2397.) Although the thermal conductivity of Si is much higher (~130 W/mK) than PbTe (~2.2 W/mK) the volume fraction of Si was low and the increase in lattice thermal conductivity only amounted to a 7% increase from that of PbTe.

High temperature Hall effect measurements were used to calculate the carrier concentration as a function of temperature for PbTe—Si(8%) samples doped with $PbI_2$. The carrier concentration was stable as a function of temperature with the exception of the undoped sample. In this sample the carrier concentration increased as the temperature increased, likely due to carrier excitation. At very high temperatures (>800K) the samples showed some increase in carrier concentration that in certain cases persisted upon cooling, perhaps a result of Pb precipitates dissolving or changes in Si doping in the PbTe matrix. However, in all measurements of electrical conductivity, Seebeck coefficient, and thermal conductivity up to ~700K the sample remained stable for several heating and cooling cycles.

The temperature dependent electron mobility was determined from the Hall and electrical conductivity measurements. At room temperature the mobility in these materials remained high (~900-1500 cm$^2$/Vs) and decreased according to the power law $\mu=aT^\alpha$ where $\alpha=1.8-2.3$. The mobility and its temperature dependence are typical of pure PbTe despite the precipitates of Pb and Si throughout the sample. (See Yu. I. Ravich, B. A. E., I. A. Smirnov, *Semiconducting Lead Chalcogenides*, Plenum Press: New York, 1970; Vol. 5; Dughaish, Z. H., *Physica B: Condensed Matter (Amsterdam, Netherlands)* 2002, 322 (1-2), 205-223; Efimova, B. A.; Kolomoets, L. A.; Ravich, Y. I.; Stavitskaya, T. S., *Fizika i Tekhnika Poluprovodnikov (Sankt-Peterburg)* 1970, 4 (10), 1929-35.) It is possible that the boundary phase between the PbTe and Si is responsible for allowing charge transport through the composite. It is also possible that there is an additive effect where the transport through the Si microprecipitates is facile and improves the overall composite mobility. In PbTe with Pb precipitates, the mobility was significantly degraded (see Heremans, J. P.; Thrush, C. M.; Morelli, D. T., *Journal of Applied Physics* 2005, 98 (6)), however such scattering processes do not appear to occur in the present samples, although they may be masked by the high mobility through the Si rods. Additionally, in the PbTe—Pb system the Seebeck coefficient increased with respect to PbTe itself although with an overall decrease in power factor. (See Heremans, J. P.; Thrush, C. M.; Morelli, D. T., *Journal of Applied Physics* 2005, 98 (6).) The PbTe—Si eutectic composites showed very similar Seebeck coefficients as $PbI_2$ doped PbTe (see Efimova, B. A.; Kolomoets, L. A.; Ravich, Y. I.; Stavitskaya, T. S., *Fizika i Tekhnika Poluprovodnikov (Sankt-Peterburg)* 1970, 4 (10), 1929-35) without any increase in the Seebeck coefficient.

A maximum ZT of 0.9 at 660K was obtained for the sample doped with 0.047% $PbI_2$ (N=$1.13 \times 10^{19}$ cm$^{-3}$). This value is similar to PbTe itself however, further increases were attained when Si was alloyed with Ge to reduce the thermal conductivity. (See Dismukes, J. P.; Ekstrom, L.; Steigmeier, E. F.; Kudman, I.; Beers, D. S., *Journal of Applied Physics* 1964, 35 (10), 2899-2907.) For the PbTe—$Si_{0.8}Ge_{0.2}$(8%) doped with $PbI_2$ the ZT was increased to 1.2 at 700K because of a reduction of thermal conductivity, similar to the PbTe—$Ge_{0.8}Si_{0.2}$(5%) composite described in Example 1.

The micro- and nanostructure in PbTe—Si(8%) influenced the electrical and thermal transport so that the ZT remained high in these materials. The electrical transport properties were tuned by n-type doping with $PbI_2$ and the resulting thermoelectric properties were comparable to PbTe itself. The lattice thermal conductivity was not significantly influenced by the presence of Si or Pb precipitates. The Lorenz number was not constant over the temperatures measured and at 650K was only ~45% of $L_o$ greatly influencing the electronic contribution to the thermal conductivity.

Example 3

Vickers Hardness

This example illustrates the methods of measuring the Vickers hardness for various PbTe/$Ge_{(1-x)}Si_x$ compositions and compares these values to the Vickers hardness for a $PbI_2$ doped PbTe composition, as described in Gelbstein et. al., Scripta materialia 58 (2008) 251-254. The Vickers hardness values were calculated as follows: A Buehler Semi-Macro indenter was used with a square pyramid Vickers indenter. Three duplicate indentations were made using a loading time of 10 seconds with a speed of 70 μm/sec at loads of 2.94N, 4.91N, and 9.81N to determine the hardness. The compositions that were tested and their corresponding hardness values as a function of minor ('second') phase content are shown in the chart of FIG. 12.

Figure 12:
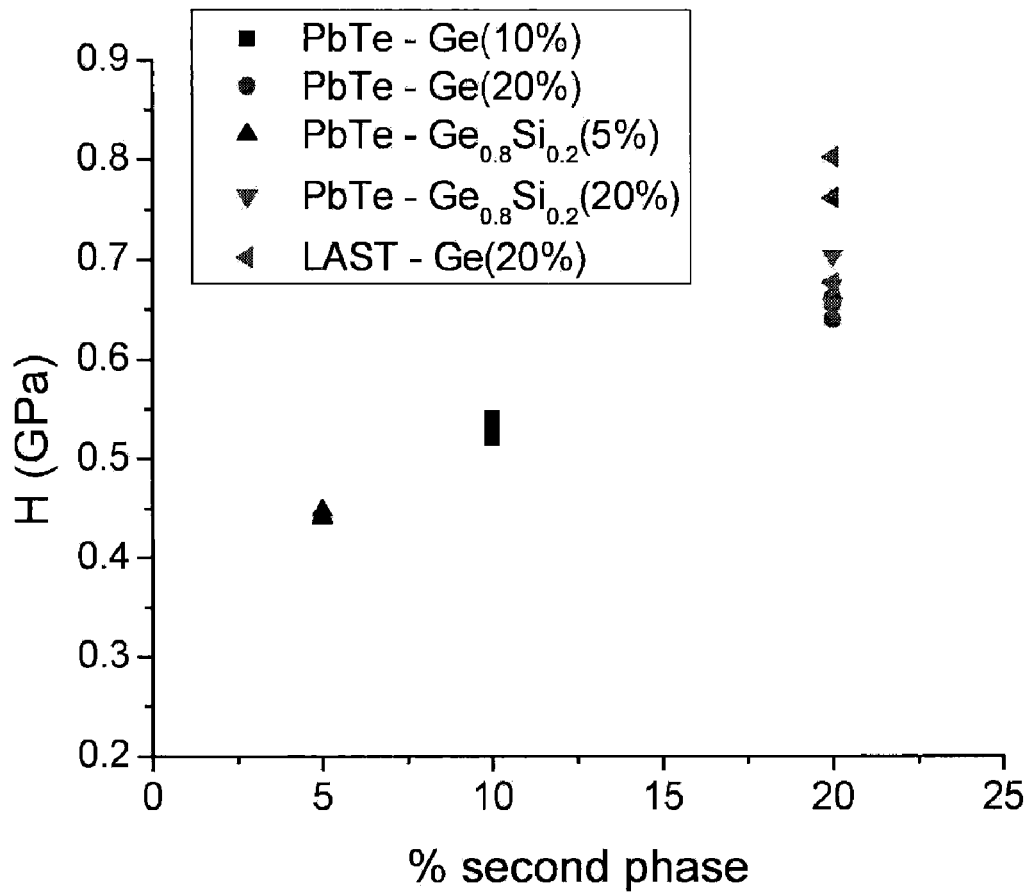
FIG. 12 shows the Vickers hardness as a function of the minor phase content for a series of PbTe—Ge$_{(1-x)}$Si$_x$ compositions.

As shown by the data of FIG. 12, the present PbTe/$Ge_{(1-x)}Si_x$ compositions have improved mechanical strengths and improved machinability crack resistance relative to the $PbI_2$ doped PbTe composition. These data represent a significant improvement over PbTe materials because PbTe is a brittle material that often fractures easily during the polishing and grinding steps necessary for sample analysis.

As used herein, and unless otherwise specified, "a" or "an" means "one or more." All patents, applications, references, and publications cited herein are incorporated by reference in their entirety to the same extent as if they were individually incorporated by reference.

As will be understood by one skilled in the art, for any and all purposes, particularly in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art, all language such as "up to," "at least," "greater than," "less than," and the like includes the number recited and refers to ranges which can be subsequently broken down into subranges as discussed above. Finally, as will be understood by one skilled in the art, a range includes each individual member.

It is specifically intended that the present invention not be limited to the embodiments and illustrations contained herein, but include modified forms of those embodiments including portions of the embodiments and combinations of elements of different embodiments as come within the scope of the following claims.

What is claimed is:

1. A composition comprising:
(a) a matrix comprising a compound having the formula MQ, wherein M is Ge, Sn, Pb or a combination thereof and Q is S, Se, Te or a combination thereof;
(b) a minor phase comprising an alloy of Ge and Si ZnTe, Co or a combination thereof; and
(c) a dopant;
wherein the minor phase is dispersed in the matrix.

2. The composition of claim 1 having a ZT of at least 1 at 700 K.

3. The composition of claim 1, wherein the composition comprises a eutectic mixture of the matrix and the minor phase.

4. The composition of claim 1, wherein the matrix comprises PbTe and the minor phase comprises an alloy of Ge and Si.

5. The composition of claim 4, wherein the alloy of Ge and Si is present in an amount of about 2 to about 30 mol. %, based on the total amount of the matrix and minor phase.

6. The composition of claim 1, wherein the minor phase comprises $Ge_{(1-x)}Si_x$ and x has a value in the range from 0.15 to 0.25.

7. The composition of claim 6 having a ZT at least 1 at 700 K.

8. The composition of claim 1 having a Vickers hardness of at least 0.4 GPa.

9. The composition of claim 1, wherein the minor phase comprises an alloy of Ge and Si.

10. The composition of claim 1, wherein the minor phase comprises ZnTe.

11. The composition of claim 1, wherein the minor phase comprises Co.

12. A composition comprising:
(a) a matrix comprising a compound having the formula MQ, wherein M is Ge, Sn, Pb or a combination thereof and Q is S, Se, Te or a combination thereof;
(b) a minor phase comprising $Ge_{(1-x)}Si_x$, ZnTe, Co or a combination thereof; and
(c) a dopant;
wherein the minor phase is dispersed in the matrix and x has a value from 0 to 1, and further
wherein the composition comprises a hypereutectic mixture of the matrix and the minor phase.

13. A composition comprising:
(a) a matrix comprising a compound having the formula MQ, wherein M is Ge, Sn, Pb or a combination thereof and Q is S, Se, Te or a combination thereof;
(b) a minor phase comprising $Ge_{(1-x)}Si_x$, ZnTe, Co or a combination thereof; and
(c) a dopant;
wherein the minor phase is dispersed in the matrix and x has a value from 0 to 1, and further wherein the dopant is $PbI_2$.

14. The composition of claim 13, wherein x = 0, the composition comprising a eutectic mixture of the PbTe and the Ge and having a ZT of at least 0.6 at 675 K.

15. The composition of claim 13, wherein x = 1, the composition comprising a hypereutectic mixture of the PbTe and the Si and having a ZT of at least 0.8 as 675 K.

16. A composition comprising:
(a) a matrix comprising a compound having the formula MQ, wherein M is Ge, Sn, Pb or a combination thereof and Q is S, Se, Te or a combination thereof; and
(b) a minor phase comprising $Ge_{(i-x)}Si_x$;
wherein the $Ge_{(1-x)}Si_x$ is dispersed in the matrix and x has a value in the range from 0.05 to 0.95.

17. The composition of claim 16, wherein the matrix comprises PbTe and the $Ge_{(1-x)}Si_x$ is present in an amount of about 2 to about 30 mol. %, based on the total amount of the matrix and minor phase.

18. The composition of claim 16 having a Vickers hardness of at least 0.4 GPa.

19. A method of making a composition, the method comprising combining a compound having the formula MQ, wherein M is Ge, Sn, Pb or a combination thereof and Q is S, Se, Te or a combination thereof, with $Ge_{(1-x)}Si_x$, ZnTe, Co or a combination thereof, and a dopant under vacuum and heating the combination at a temperature and for a time sufficient to form a composition comprising a minor phase of $Ge_{(1-x)}Si_x$, ZnTe, Co or a combination thereof dispersed in a matrix of the compound having the formula MQ, wherein x has a value from 0 to 1.

20. The method of claim 19, wherein the composition comprises a eutectic mixture of the matrix and the minor phase.

21. The method of claim 19, wherein the composition comprises a hypereutectic mixture of the matrix and the minor phase.

22. The method of claim 19, wherein the matrix comprises PbTe, the minor phase comprises $Ge_{(1-x)}Si_x$, and the $Ge_{(1-x)}Si_x$ is present in an amount of about 2 to about 30 mol. %, based on the total amount of the matrix and minor phase.

23. A method for power generation comprising placing a composition in thermal contact with a heat source whereby the composition generates electricity and powering an electrical device with the electricity, the composition comprising:
(a) a matrix comprising a compound having the formula MQ, wherein M is Ge, Sn, Pb or a combination thereof and Q is S, Se, Te or a combination thereof;
(b) a minor phase comprising $Ge_{(1-x)}Si_x$, ZnTe, Co or a combination thereof; and
(c) a dopant;
wherein the minor phase is dispersed in the matrix and x has a value from 0 to 1.

* * * * *

UNITED STATES PATENT AND TRADEMARK OFFICE
CERTIFICATE OF CORRECTION

PATENT NO. : 8,277,677 B2
APPLICATION NO. : 12/487893
DATED : October 2, 2012
INVENTOR(S) : Mercouri G. Kanatzidis It is certified that error appears in the above-identified patent and that said Letters Patent is hereby corrected as shown below:

IN THE CLAIMS

Col. 19, Line 38 (Claim 1)
Delete "alloy of Ge and Si ZnTe" and replace with --alloy of Ge and Si, ZnTe--

Col. 20, Line 23 (Claim 15)
Delete "0.8 as 675 K" and replace with --0.8 at 675 K--

Col. 20, Line 28 (Claim 16)
Delete "comprising $Ge_{(i-x)}Si_x$" and replace with --comprising $Ge_{(l-x)}Si_x$--

Signed and Sealed this
Fifth Day of February, 2013

Teresa Stanek Rea
*Acting Director of the United States Patent and Trademark Office*